United States Patent
Kitagawa

(10) Patent No.: US 8,803,576 B2
(45) Date of Patent: Aug. 12, 2014

(54) SEMICONDUCTOR DEVICE HAVING DUTY-CYCLE CORRECTION CIRCUIT

(71) Applicant: Elpida Memory, Inc., Tokyo (JP)

(72) Inventor: Katsuhiro Kitagawa, Tokyo (JP)

(*) Notice: Subject to any disclaimer, the term of this patent is extended or adjusted under 35 U.S.C. 154(b) by 0 days.

(21) Appl. No.: 13/761,137

(22) Filed: Feb. 6, 2013

(65) Prior Publication Data

US 2013/0207701 A1    Aug. 15, 2013

(30) Foreign Application Priority Data

Feb. 9, 2012    (JP) .................................. 2012-026661

(51) Int. Cl.
*H03L 7/06*    (2006.01)
*H03K 5/06*    (2006.01)

(52) U.S. Cl.
CPC ................ *H03K 5/06* (2013.01); *H03K 5/1656* (2013.01)
USPC .......................................... 327/158; 327/147

(58) Field of Classification Search
CPC ..... H03L 7/0814; H03L 7/0812; G11C 7/222
USPC ................................................ 327/149, 158
See application file for complete search history.

(56) References Cited

U.S. PATENT DOCUMENTS

| 8,299,829 | B2 | 10/2012 | Kitagawa | |
|---|---|---|---|---|
| 2007/0069776 | A1* | 3/2007 | Hur | 327/158 |
| 2007/0182472 | A1* | 8/2007 | Cho | 327/175 |
| 2008/0284478 | A1* | 11/2008 | Cho | 327/165 |
| 2009/0256604 | A1* | 10/2009 | Ku | 327/158 |
| 2010/0237917 | A1* | 9/2010 | Monma | 327/158 |
| 2011/0227619 | A1 | 9/2011 | Kitagawa | |
| 2013/0043919 | A1* | 2/2013 | Kitagawa | 327/158 |
| 2013/0207701 | A1* | 8/2013 | Kitagawa | 327/158 |
| 2013/0249612 | A1* | 9/2013 | Zerbe et al. | 327/161 |

FOREIGN PATENT DOCUMENTS

JP    2011-199617 A    10/2011

* cited by examiner

*Primary Examiner* — Adam Houston
(74) *Attorney, Agent, or Firm* — McGinn IP Law Group, PLLC

(57) ABSTRACT

Disclosed herein is a semiconductor device that includes: an input node; an output node; a plurality of variable delay circuits connected in series between the input node and the output node; a control circuit that commonly controls delay amounts of the variable delay circuits based on phases of a first clock signal supplied to the input node and a second clock signal output from the output node; and a mixer circuit that generates a third clock signal based on any one of input clock signals respectively input to the variable delay circuits and any one of output clock signals respectively output from the variable delay circuits.

16 Claims, 20 Drawing Sheets

SEMICONDUCTOR DEVICE HAVING DUTY-CYCLE CORRECTION CIRCUIT

BACKGROUND OF THE INVENTION

1. Field of the Invention

The present invention relates to a semiconductor device, and more particularly relates to a semiconductor device including a duty-cycle correction circuit.

2. Description of Related Art

In a semiconductor device that performs operations in synchronization with a clock signal, such as a synchronous DRAM (Dynamic Random Access Memory), an internal clock signal that is phase-controlled may be required. The phase-controlled internal clock signal is mainly generated by a DLL (Delay Locked Loop) circuit. In a general DLL circuit, the phase control is performed by adjusting a rising edge timing of the internal clock signal.

Meanwhile, in a DDR (Double Data Rate) DRAM, input and output of data are performed in synchronization with both a rising edge and a falling edge of the internal clock signal, and therefore it is required to accurately control a falling edge timing as well as a rising edge timing. The falling edge timing of the internal clock signal is generally adjusted by a circuit referred to as "duty-cycle correction circuit".

A general duty-cycle correction circuit includes two capacitors, of which one capacitor is discharged when an internal clock signal is at a high level and the other capacitor is discharged when the internal clock signal is at a low level. When the duty cycle of the internal clock signal is 50%, the two capacitors are equally discharged, and no potential difference is generated between the two capacitors. This state means that a period from the rising edge to the falling edge (or a period from the falling edge to the rising edge) of the internal clock signal is exactly ½ of a clock cycle. On the other hand, when the duty cycle of the internal clock signal is less than or larger than 50%, the discharge amounts of the two capacitors are not equal to each other, and accordingly a potential difference is generated between the two capacitors. This state means that the period from the rising edge to the falling edge (or the period from the falling edge to the rising edge) of the internal clock signal is shifted from ½ of a clock cycle. In this case, control is performed to make the duty cycle close to 50% by advancing or delaying the falling edge timing.

However, the general duty-cycle correction circuit mentioned above has some problems explained as follows.

The first problem is that two capacitors with a relatively large capacitance are required. Because a capacitor with a large capacitance occupies a large area on a semiconductor chip, the chip area is increased. The second problem is that an analog amplifier circuit is required to detect a potential difference generated between the two capacitors. While a highly-accurate analog amplifier circuit is required to detect a minute potential difference, it is difficult to obtain the high accuracy due to various factors such as a fluctuation of a threshold value generated between a plurality of transistors. The third problem is that a discharge operation needs to be performed across a plurality of clock cycles to amplify a potential difference generated between two capacitors, so that it takes time to detect the duty cycle. The fourth problem is that potentials of capacitors need to be maintained correctly during a discharge operation is performed across clock cycles. This means that the duty-cycle correction circuit is likely to be affected by noise, which makes it difficult to perform a stable duty-cycle determination operation. The fifth problem is that, when the duty cycle of the internal clock signal is near 50%, there is little potential difference between two capacitors, which is likely to cause a malfunction of the device. This problem becomes more conspicuous when the frequency of the internal clock signal is high, because the higher the frequency of the internal clock signal is the shorter a discharge period becomes.

As a duty-cycle correction circuit that solves these problems, the present invertor have proposed a new type of duty-cycle correction circuit (see Japanese Patent Application Laid-open No. 2011-199617). The duty-cycle correction circuit disclosed in Japanese Patent Application Laid-open No. 2011-199617 performs an operation of setting a count value to ½ by a calculation when a delay amount of a delay line is one clock cycle and an operation of specifying a falling edge timing of an internal clock signal from a delay amount obtained by the value. The duty-cycle correction circuit disclosed in Japanese Patent Application Laid-open No. 2011-199617 is an excellent circuit that solves the five problems mentioned above.

However, there may be a case where a plurality of delay elements that constitute a delay line do not necessarily have the same delay amount. This is because some resistive elements and capacitive elements for adjustment are connected to the delay line for a fine adjustment of the delay amount. In this case, even if the count value is set to ½ when the delay amount of the delay line is one clock cycle, it is not always the case that the delay amount obtained by the value is correctly ½ of a clock cycle. This problem occurs not only in the duty-cycle correction circuit used in a DLL circuit, but also any type of circuit that requires accurate control of the duty cycle of the clock signal.

SUMMARY

In one embodiment, there is provided a semiconductor device that includes: an input node; an output node; a plurality of variable delay circuits connected in series between the input node and the output node; a control circuit that commonly controls delay amounts of the variable delay circuits based on phases of a first clock signal supplied to the input node and a second clock signal output from the output node; and a mixer circuit that generates a third clock signal based on any one of input clock signals respectively input to the variable delay circuits and any one of output clock signals respectively output from the variable delay circuits.

In another embodiment, there is provided a method of controlling a semiconductor device, the method including: generating a first clock signal by delaying an input clock signal based on a delay time; generating a second clock signal by delaying the first clock signal based on the delay time; comparing a phase of the second clock signal with a phase of the input clock signal to control the delay time; and mixing the first clock signal and the second clock signal to generate a third clock signal.

According to the present invention, some problems that the general duty cycle correction circuit has are resolved and it is possible to more accurately control the duty cycle of the clock signal.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
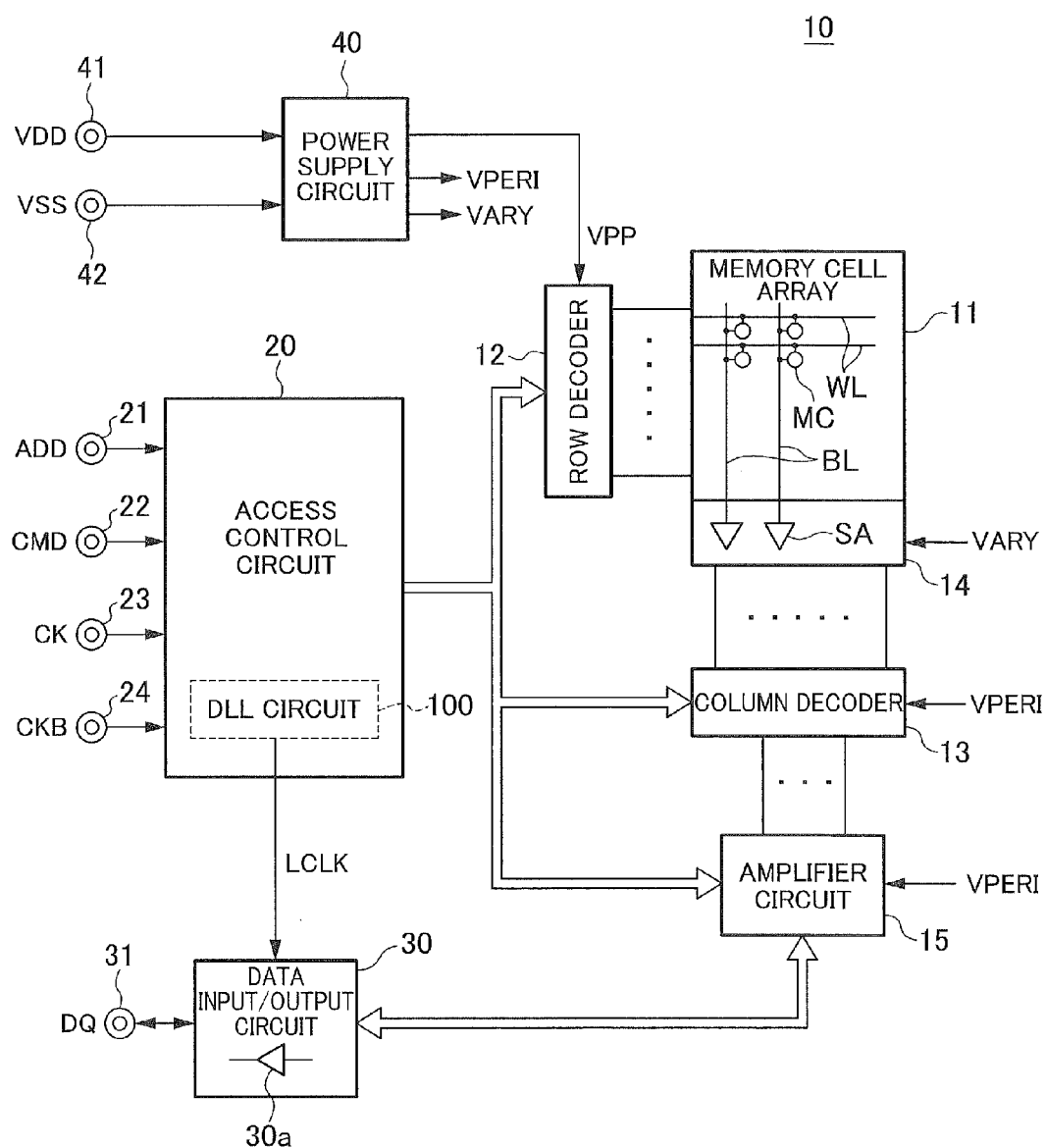
FIG. 1 is a block diagram indicative of a general configuration of a semiconductor device according to a preferred embodiment of the present invention.

Referring now to FIG. 1, the semiconductor device 10 according to the first embodiment of the present invention is a DRAM and includes the memory cell array 11. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA.

Operations of the row decoder 12, the column decoder 13, the sense circuit 14, and the amplifier circuit 15 are controlled by an access control circuit 20. An address signal ADD, a command signal CMD, external clock signals CK and CKB, a clock enable signal CKE, and the like are supplied to the access control circuit 20 through terminals 21 to 24. The external clock signals CK and CKB are signals complementary to each other. The access control circuit 20 controls the row decoder 12, the column decoder 13, the sense circuit 14, the amplifier circuit 15, and a data input/output circuit 30 based on these signals.

Specifically, when the command signal CMD indicates the active command, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing.

On the other hand, when the command signal CMD indicates the read command or the write command, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit 15 and the sense amplifier SA.

The access control circuit 20 includes a DLL circuit 100. The DLL circuit 100 generates an internal clock signal LCLK that is phase-controlled based on the external clock signals CK and CKB. The internal clock signal LCLK is supplied to an output buffer circuit 30a included in the data input/output circuit 30. The read data read from the memory cell array 11 is output from the data terminal 31 in synchronism with the internal clock signal LCLK.

Each of the foregoing circuit blocks uses a predetermined internal voltage as its operating power supply. Such internal power supplies are generated by a power supply circuit 40. The power supply circuit 40 receives an external potential VDD and a ground potential VSS that are supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is mainly used in the row decoder 12. The row decoder 12 drives a word line WL selected based on the address signal ADD to the VPP level, thereby making the cell transistors included in the memory cells MC conductive. The internal voltage VARY is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. Using the internal voltage VPERI lower than the external voltage VDD as the operating voltage of the peripheral circuits reduces power consumption of the semiconductor device 10.

Figure 2:
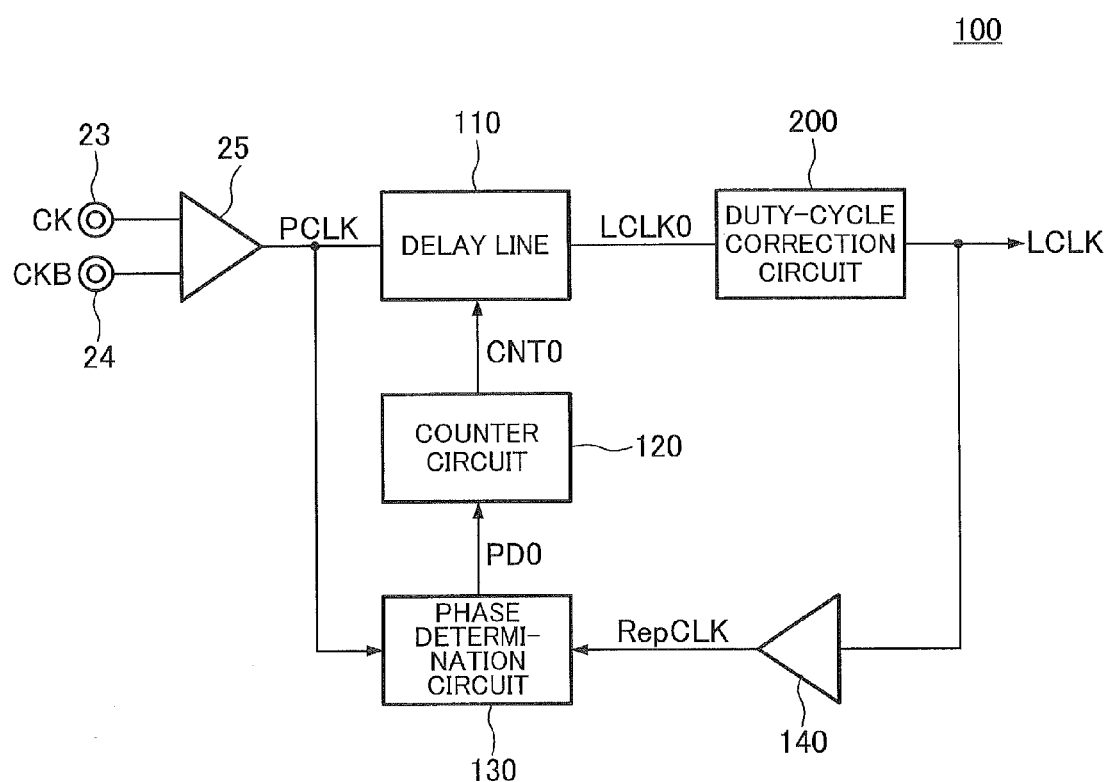
FIG. 2 is a block diagram of a configuration of the DLL circuit shown in FIG. 1.

Turning to FIG. 2, the DLL circuit 100 includes a delay line 110 that generates an internal clock signal LCLK0 by delaying an internal clock signal PCLK, a counter circuit 120 that controls a delay amount of the delay line 110, and a phase determination circuit 130 that controls a count value CNT0 of the counter circuit 120. The internal clock signal PCLK is a signal output from a clock receiver 25 that receives the external clock signals CK and CKB. The internal clock signal LCLK0 output from the delay line 110 is supplied to a duty-cycle correction circuit 200. The duty-cycle correction circuit 200 is a circuit for correcting the duty cycle of the internal clock signal LCLK0 to 50%. The internal clock signal LCLK output from the duty-cycle correction circuit 200 is supplied to the output buffer circuit 30*a* shown in FIG. 1 and used as a signal for defining an output timing of the read data DQ.

The internal clock signal LCLK is supplied to a replica circuit 140. The replica circuit 140 is a circuit having substantially the same characteristic as that of the output buffer circuit 30*a*, and an output of the replica circuit 140 is used as a replica clock signal RepCLK. Because the output buffer circuit 30*a* outputs the read data DQ in synchronization with the internal clock signal LCLK, the replica clock signal RepCLK output from the replica circuit 140 is accurately synchronized with the read data DQ. In the DRAM, the read data DQ needs to be accurately synchronized with the external clock signals CK and CKB, and when there is a phase shift between the read data DQ and the external clock signals CK and CKB, the phase shift needs to be detected and corrected. The detection of the phase shift is performed by the phase determination circuit 130, and a result of the determination is output as a phase determination signal PD0. The phase determination signal PD0 is fed back to the counter circuit 120, by which the phase shift is corrected.

As described above, the phase determination circuit 130 is a circuit that compares the internal clock signal PCLK with the replica clock signal RepCLK and generates the phase determination signal PD0 based on a result of the comparison. The internal clock signal PCLK is a signal of which the rising edge timing matches the rising edge timing of the external clock signal CK (a falling edge timing of the external signal CKB), and the replica clock signal RepCLK is a signal of which the timing matches the timing of the read data DQ, and therefore the phase determination circuit 130 indirectly compares the rising edge of the external clock signal CK with the phase of the read data DQ.

As a result of the comparison, when the replica clock signal RepCLK is lagged with respect to the internal clock signal PCLK, the phase determination circuit 130 sets the phase determination signal PD0 to one of the logical levels (for example, low level). In response to this, the count value CNT0 of the counter circuit 120 is counted down, by which the delay amount of the delay line 110 is decreased. On the other hand, if the replica clock signal RepCLK is advanced with respect to the internal clock signal PCLK, the phase determination circuit 130 sets the phase determination signal PD0 to the other of the logical levels (for example, high level). In response to this, the count value ONTO of the counter circuit 120 is counted up, by which the delay amount of the delay line 110 is increased. By periodically repeating these operations, the phases of the internal clock signal PCLK and the replica clock signal RepCLK are caused to match each other, and as a result, the rising edges of the read data DQ and the external clock signal CK are caused to match each other.

Figure 3:
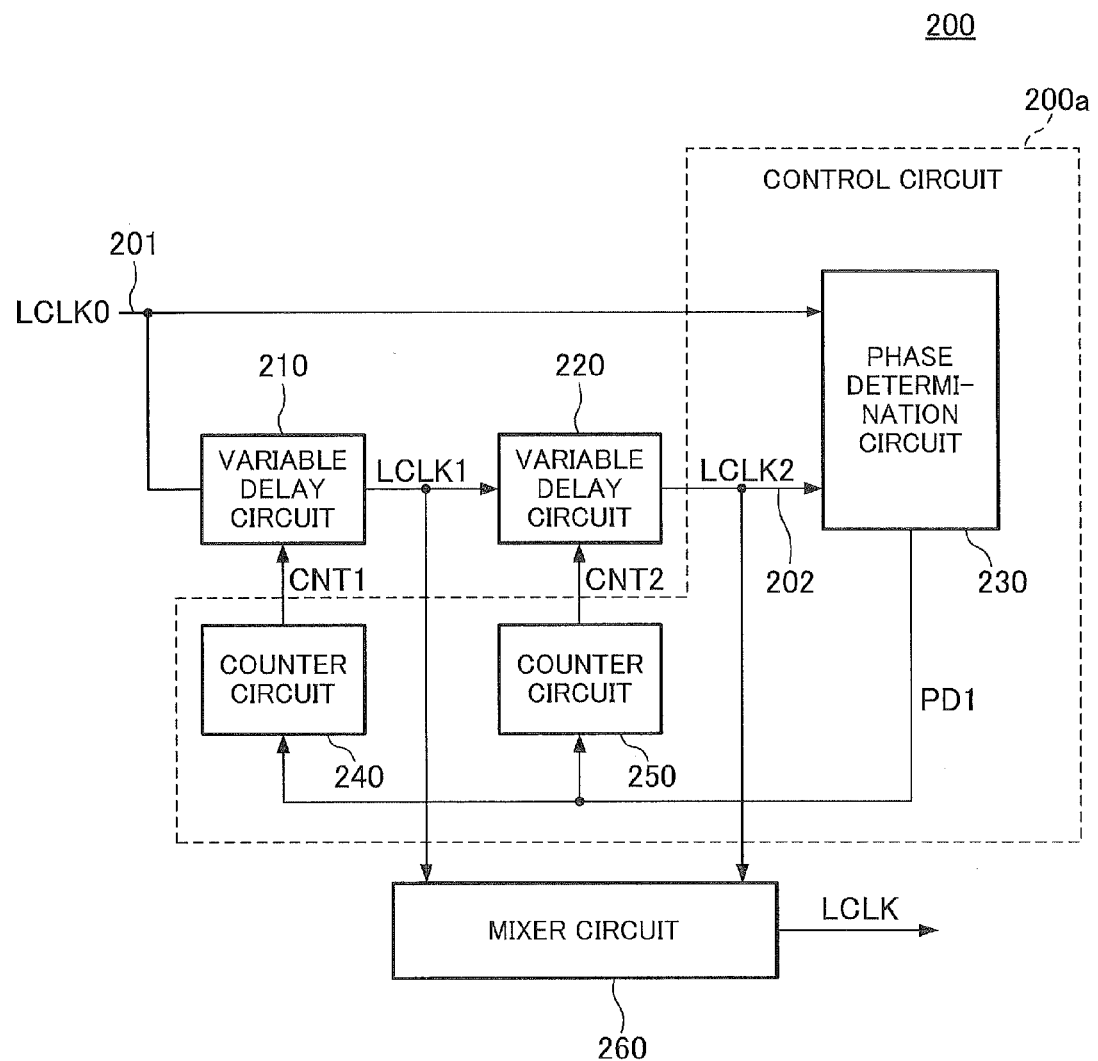
FIG. 3 is a circuit diagram of a duty-cycle correction circuit shown in FIG. 2 according to a first embodiment of the present invention.

Turning to FIG. 3, the duty-cycle correction circuit 200 includes two variable delay circuits 210 and 220 connected in series between an input node 201 and an output node 202 and a control circuit 200*a* that controls delay amounts of the variable delay circuits 210 and 220 in such a manner that the phases of the internal clock signal LCLK0 supplied to the input node 201 and an internal clock signal LCLK2 output from the output node 202 match each other. The control circuit 200*a* includes a phase determination circuit 230 that compares the phase of the internal clock signal LCLK0 with the phase of the internal clock signal LCLK2 and counter circuits 240 and 250 that respectively controls the delay amounts of the variable delay circuits 210 and 220.

The phase determination circuit 230 generates a phase determination signal PD1 by comparing the phase of the internal clock signal LCLK0 with the phase of the internal clock signal LCLK2. The phase determination signal PD1 is commonly supplied to the counter circuits 240 and 250, by which count values CNT1 and CNT2 of the counter circuits 240 and 250 are constantly controlled to the same value.

Specifically, if the phase of the internal clock signal LCLK2 is lagged with respect to the phase of the internal clock signal LCLK0, the phase determination circuit 230 sets the phase determination signal PD1 to one of the logical levels (for example, low level). In response to this, the counter circuits 240 and 250 are counted up, by which the delay amounts of the variable delay circuits 210 and 220 are decreased. On the other hand, if the phase of the internal clock signal LCLK2 is advanced with respect to the phase of the internal clock signal LCLK0, the phase determination circuit 230 sets the phase determination signal PD1 to the other of the logical levels (for example, high level). In response to this, the counter circuits 240 and 250 are counted down, by which the delay amounts of the variable delay circuits 210 and 220 are increased. Therefore, by periodically repeating these operations, it is possible to match the phases of the internal clock signal LCLK0 and the internal clock signal LCLK2. A state where the phases of the internal clock signal LCLK0 and the internal clock signal LCLK2 match each other corresponds to a state where the internal clock signal LCLK2 is lagged with respect to the internal clock signal LCLK0 exactly by one clock cycle.

An internal clock signal LCLK1 output from the variable delay circuit 210 and the internal clock signal LCLK2 output from the variable delay circuit 220 are supplied to a mixer circuit 260. The mixer circuit 260 is a circuit that generates the internal clock signal LCLK based on the internal clock signals LCLK1 and LCLK2. Specifically, the rising edge (or a falling edge) of the internal clock signal LCLK is defined based on the internal clock signal LCLK1, and the falling edge (or a rising edge) of the internal clock signal LCLK is defined based on the internal clock signal LCLK2.

Figure 4:
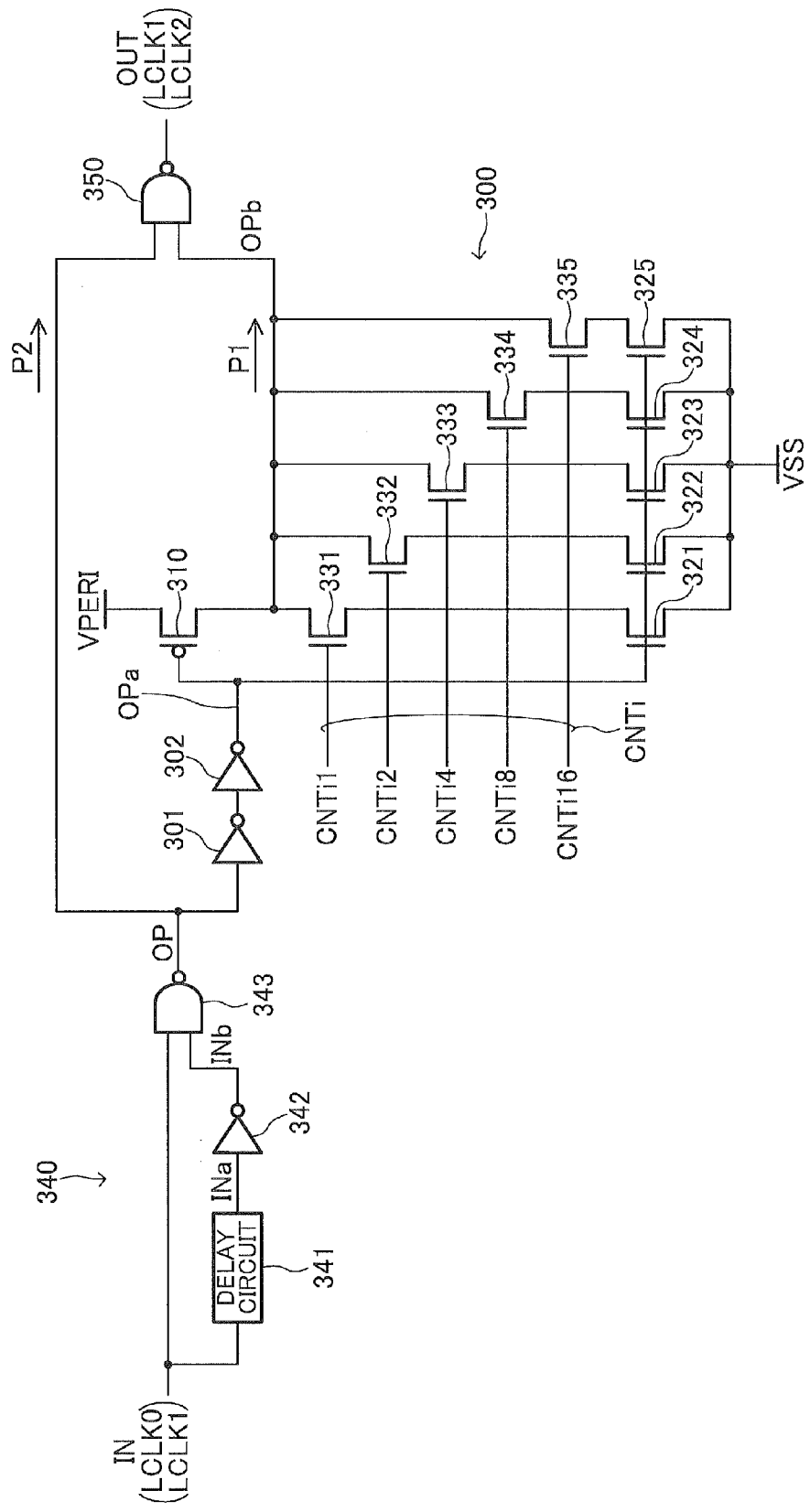
FIG. 4 is a circuit diagram of variable delay circuits shown in FIG. 3.

Turning to FIG. 4, each of the variable delay circuits 210 and 220 includes a one-shot pulse generation unit 340 that generates a one-shot pulse based on an input clock signal IN (the internal clock signal LCLK0 or LCLK1), a delay-amount adjustment unit 300 that is provided at a subsequent stage of the one-shot pulse generation unit 340, and a NAND gate circuit 350 that receives signals from a first signal path P1 that passes through the delay-amount adjustment unit 300 and a second signal path P2 that does not pass through the delay-amount adjustment unit 300.

The one-shot pulse generation unit 340 includes a delay circuit 341 that generates a clock signal INa by delaying the input clock signal IN, an inverter 342 that generates a clock signal INb by inverting the clock signal INa, and a NAND gate circuit 343 that receives the clock signals IN and INb and generates a one-shot pulse OP. The input clock signal IN is the internal clock signal LCLK0 in the case of the variable delay circuit 210 at the first stage and the internal clock signal LCLK1 in the case of the variable delay circuit 220 at the second stage.

The delay-amount adjustment unit 300 includes two stages of inverters 301 and 302 that buffer the one-shot pulse OP to generate a one-shot pulse OPa, a P-channel MOS transistor 310 and N-channel MOS transistors 321 to 325 having gate electrodes that receive the one-shot pulse OPa, respectively, and N-channel MOS transistors 331 to 335 connected in series to the transistors 321 to 325, respectively. A source of the transistor 310 is connected to the high-potential-side power supply potential VPERI, and sources of the transistors 321 to 325 are connected to the low-potential-side power supply potential VSS. Furthermore, a drain of the transistor 310 and drains of the transistors 331 to 335 are commonly connected and function as an output node from which a one-shot pulse OPb is output.

Corresponding bits of a count value CNTi (i=1, 2) are supplied to gate electrodes of the transistors 331 to 335 connected in parallel, respectively. In an example shown in FIG. 4, the count value CNTi is constituted by a five-bit binary signal, and a least significant bit CNTi1 is supplied to the gate electrode of the transistor 331. Similarly, a bit CNTi2 is supplied to the gate electrode of the transistor 332, a bit CNTi4 is supplied to the gate electrode of the transistor 333, a bit CNTi8 is supplied to the gate electrode of the transistor 334, and a most significant bit CNTi16 is supplied to the gate electrode of the transistor 335. In the present invention, the transistors 331 to 335 are often referred to as "driver circuits". The transistors 331 to 335 have different channel widths, which correspond to weights of the binary signal, respectively. That is, when the channel width of the transistor 331 is W, the channel widths of the transistors 332 to 335 are designed to be 2×W, 4×W, 8×W, and 16×W, respectively.

Driving capabilities of the respective transistors 331 to 335 are proportional to the channel widths, respectively. Accordingly, it is possible to adjust a speed at which the one-shot pulse OPb changes to a low level to 31 steps by selecting one or more transistors from the transistors 331 to 335. It suffices to set the count value CNTi to a maximum value (set all the bits CNTi1 to CNTi16 to a high level) so as to change the clock signal INai to a low level at a highest speed. In this case, all current paths are effective. Furthermore, it suffices to set the count value CNTi to a minimum value (set only the bit CNTi1 to a high level and the other bits CNTi2 to CNTi16 to a low level) so as to change the clock signal INai to a low level at a lowest speed. In this case, only the current path constituted by the transistors 331 and 321 is effective.

The one-shot pulse OPb generated in this manner is supplied to one input node of the NAND gate circuit 350. The one-shot pulse OP that does not pass through the delay-amount adjustment unit 300 is supplied to the other input node of the NAND gate circuit 350. An output clock signal OUT that is output from the NAND gate circuit 350 is the internal clock signal LCLK1 in the case of the variable delay circuit 210 and the internal clock signal LCLK2 in the case of the variable delay circuit 220.

Figure 5:
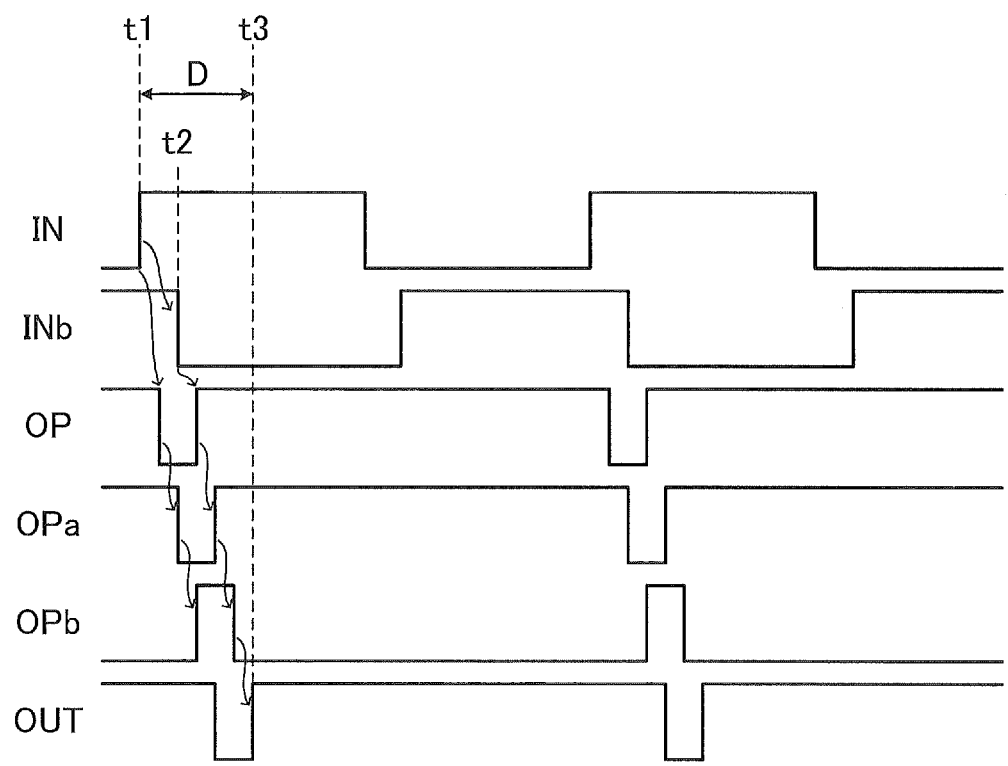
FIG. 5 is a timing diagram for explaining an operation of the variable delay circuit shown in FIG. 4.

Turning to FIG. 5, the rising edge of the input clock signal IN appears at a time t1 and the falling edge of the clock signal INb appears at a time t2. This means that a time period from the time t1 to the time t2 corresponds to a delay amount of the delay circuit 341 and the inverter 342. This delay amount is 150 ps, for example.

The clock signals IN and INb are supplied to the NAND gate circuit 343, by which the one-shot pulse OP is generated. The falling edge of the one-shot pulse OP is synchronized with the time t1 and the rising edge of the one-shot pulse OP is synchronized with the time t2. However, due to the delay by the NAND gate circuit 343, the falling edge and the rising edge of the one-shot pulse OP are delayed from the times t1 and t2, respectively, by 50 ps, for example.

The one-shot pulse OP is supplied to the inverters 301 and 302, and output as a one-shot pulse OPa. The rising edge and the falling edge of the one-shot pulse OPa are delayed from the rising edge and the falling edge of the one-shot pulse OP, respectively, by 100 ps, for example, due to delays of the inverters 301 and 302.

When the one-shot pulse OPa is changed to a low level, the transistor 310 is switched on, and therefore the one-shot pulse OPb that is an output of the delay-amount adjustment unit 300 is changed to a high level. A time period from when the one-shot pulse OPa is changed to a low level to when the one-shot pulse OPb is changed to a high level is a fixed value determined by the driving capability of the transistor 310, which is 50 ps, for example. On the other hand, when the one-shot pulse OPa is changed to a high level, the transistors 321 to 325 are switched on, and therefore the one-shot pulse OPb that is an output of the delay-amount adjustment unit 300 is changed to a low level. A time period from when the one-shot pulse OPa is changed to a high level to when the one-shot pulse OPb is changed to a low level is determined by the count value CNT1. The example shown in FIG. 5 shows a case where the count value CNT1 is the maximum value, that is, the delay amount of the delay-amount adjustment unit 300 is minimized, where the delay amount is 50 ps, for example.

The one-shot pulse OPb is supplied to the NAND gate circuit 350 together with the one-shot pulse OP, by which the output clock signal OUT is generated. The timing at which the output clock signal OUT is changed from a high level to a low level is synchronized with the timing at which the clock signal INb or the one-shot pulse OPb is changed from a low level to a high level. Therefore, this timing is fixed. On the other hand, the timing at which the output clock signal OUT is changed from a low level to a high level is synchronized with the timing at which the one-shot pulse OPb is changed from a high level to a low level, and therefore this timing depends on the count value CNT1. A delay amount by the NAND gate circuit 350 is 50 ps, for example. In FIG. 5, the rising edge of the output clock signal OUT appears at a time t3. In this manner, both the rising edge and the falling edge of the output clock signal OUT are edges based on the rising edge of input clock signal IN. In other words, the falling edge of the input clock signal IN is independent of both the rising edge and the falling edge of the output clock signal OUT.

With the above operation, a delay time D from the rising edge of the input clock signal IN to the rising edge of the output clock signal OUT is defined by a sum of the fixed delay amount of each of various gate circuits and the variable delay amount determined by the count value CNT1. In FIG. 5, a case where the count value CNT1 is the maximum value, that is, a case where the delay amount of the delay-amount adjustment unit 300 is minimized is shown, and in this case, the delay time D is 400 ps (=150+50+100+50+50 ps). This corresponds to the minimum delay time of the variable delay circuit 210. The delay time D of the variable delay circuit 210 is increased as the count value CNT1 is decreased.

The operation described above is performed also in the variable delay circuit 220 in the same manner. This is because the count values CNT1 and CNT2 respectively supplied to the variable delay circuits 210 and 220 are considered to be constantly the same. That is, the delay amounts of the variable delay circuits 210 and 220 are controlled to be the same as each other.

An operation of the duty-cycle correction circuit 200 where the phase of an internal clock signal LCLK2 is advanced with respect to the phase of an internal clock signal LCLK0 is explained with reference to FIG. 6.

Figure 6:
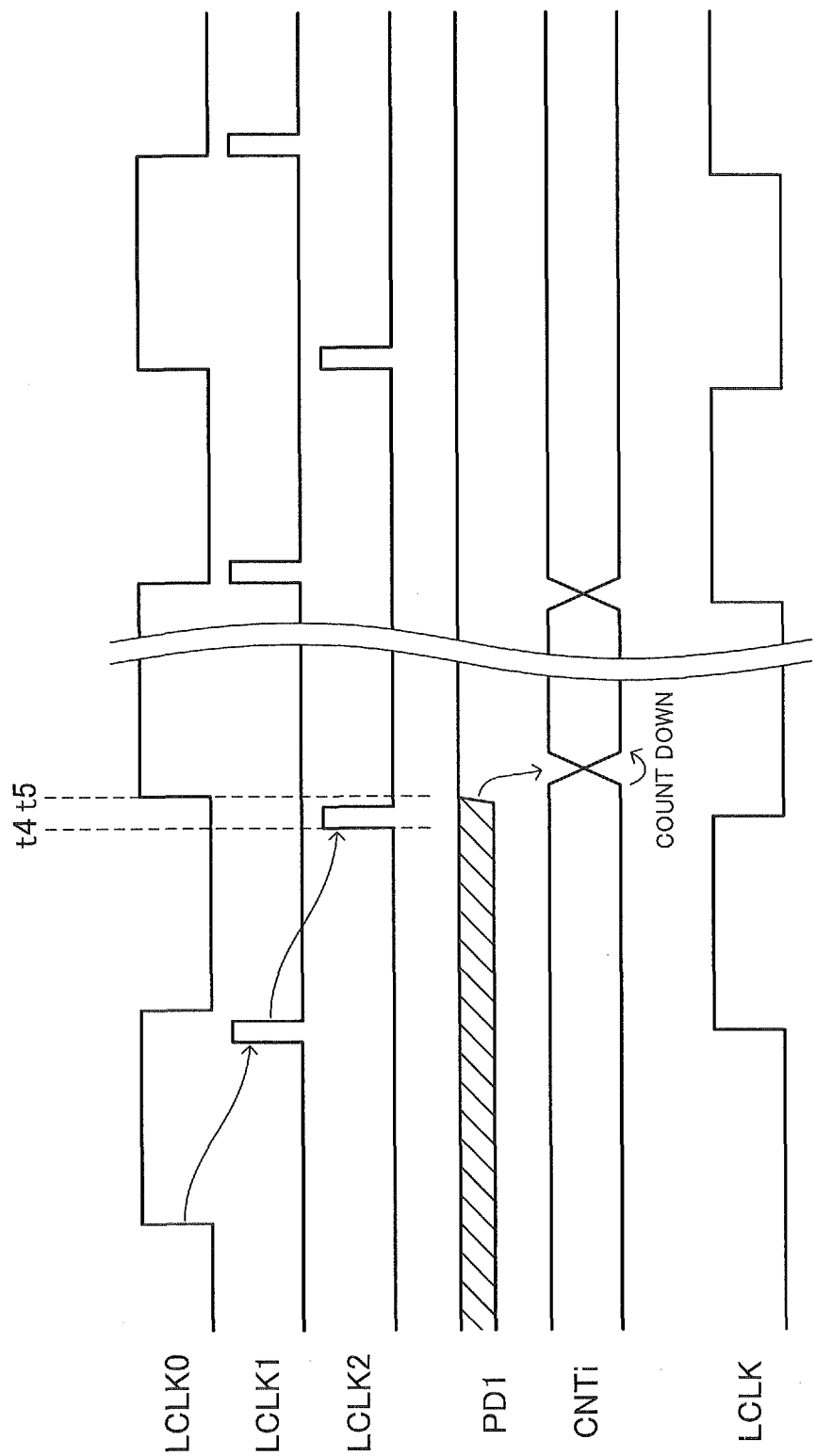
FIG. 6 is a timing diagram for explaining an operation of the duty-cycle correction circuit shown in FIG. 3, where the phase of an internal clock signal LCLK2 is advanced with respect to the phase of an internal clock signal LCLK0.

In the example shown FIG. 6, a time t4 at which the rising edge of the internal clock signal LCLK2 appears is earlier than a time t5 at which the rising edge of the internal clock signal LCLK0 appears. When the phase of the internal clock signal LCLK2 is advanced with respect to the phase of the internal clock signal LCLK0 in this manner, the phase determination signal PD1 output from the phase determination circuit 230 becomes a high level, for example. This causes the count values CNT1 and CNT2 of the counter circuits 240 and 250 to be counted down, and the driving capabilities of the transistors 331 to 335 are decreased. As a result, the delay amounts of the variable delay circuits 210 and 220 are increased. When the phase of the internal clock signal LCLK2 is advanced with respect to the phase of the internal clock signal LCLK0, the duty cycle of the internal clock signal LCLK output from the mixer circuit 260 is less than 50%. In this case, the count values CNT1 and CNT2 are continued to be counted down, so that the duty cycle of the internal clock signal LCLK is increased to 50%.

Figure 7:
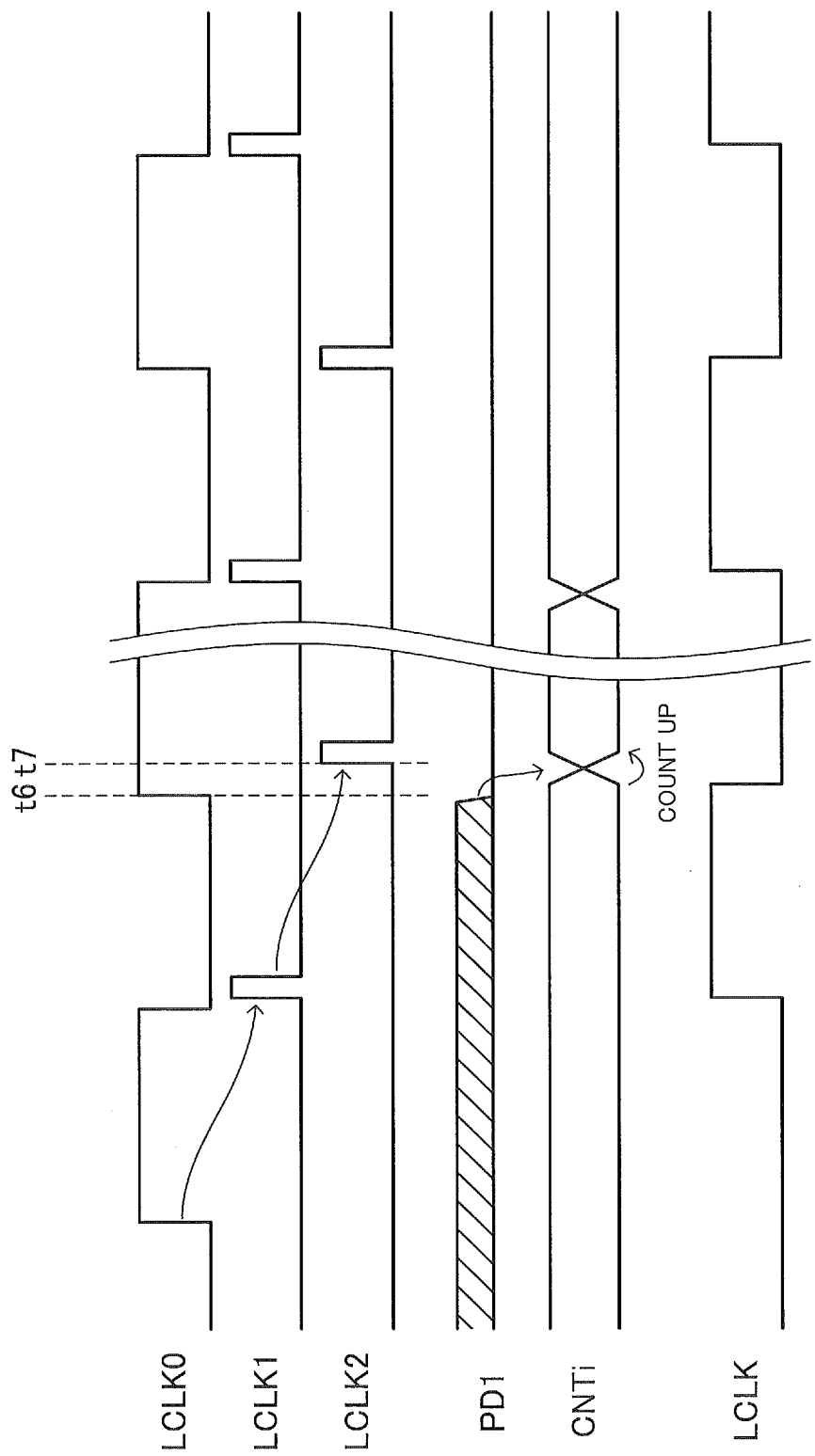
FIG. 7 is a timing diagram for explaining an operation of the duty-cycle correction circuit shown in FIG. 3, where the phase of the internal clock signal LCLK2 is lagged with respect to the phase of the internal clock signal LCLK0.

An operation of the duty-cycle correction circuit 200 where the phase of the internal clock signal LCLK2 is lagged with respect to the phase of the internal clock signal LCLK0 is explained with reference to FIG. 7. In the example shown in FIG. 7, a time t7 at which the rising edge of the internal clock signal LCLK2 appears is later than a time t6 at which the rising edge of the internal clock signal LCLK0 appears. When the phase of the internal clock signal LCLK2 is lagged with respect to the phase of the internal clock signal LCLK0 in this manner, the phase determination signal PD1 output from the phase determination circuit 230 becomes a low level, for example. This causes the count values CNT1 and CNT2 of the counter circuits 240 and 250 to be counted up, and the driving capabilities of the transistors 331 to 335 are increased. As a result, the delay amounts of the variable delay circuits 210 and 220 are decreased. When the phase of the internal clock signal LCLK2 is lagged with respect to the phase of the internal clock signal LCLK0, the duty cycle of the internal clock signal LCLK output from the mixer circuit 260 exceeds 50%. In this case, the count values CNT1 and CNT2 are continued to be counted up, so that the duty cycle of the internal clock signal LCLK is decreased to 50%.

Figure 8:
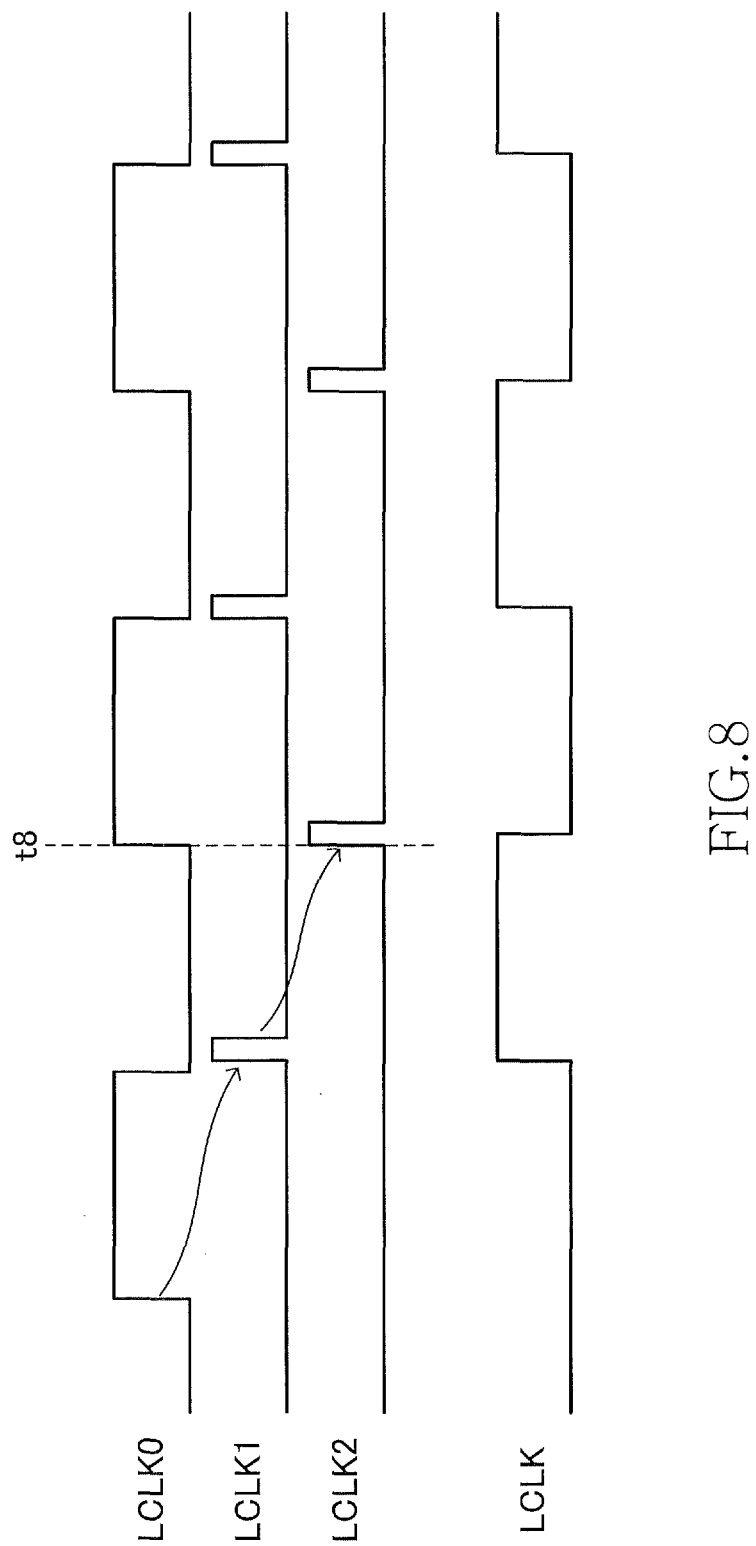
FIG. 8 is a timing diagram for explaining an operation of the duty-cycle correction circuit shown in FIG. 3, where the phase of the internal clock signal LCLK2 matches the phase of the internal clock signal LCLK0.

By repeating such operations, as shown in FIG. 8, the phase of the internal clock signal LCLK2 is controlled to match the phase of the internal clock signal LCLK0. In the example shown in FIG. 8, both the rising edge of the internal clock signal LCLK0 and the rising edge of the internal clock signal LCLK2 appear at a time t8. In this case, the duty cycle of the internal clock signal LCLK output from the mixer circuit 260 is substantially 50%. When the duty cycle of the internal clock signal LCLK is substantially 50%, the phase determination signal PD1 takes a high level and a low level in an alternate manner.

Figure 9:
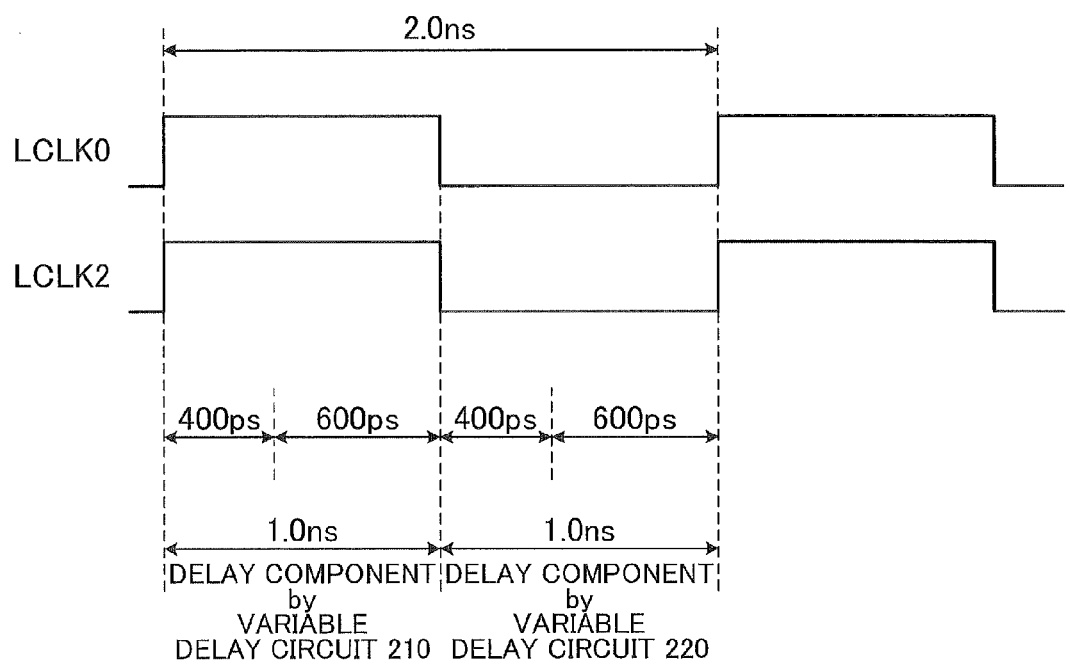
FIG. 9 is a diagram for explaining delay components of the variable delay circuits shown in FIG. 3 where phases of the internal clock signal LCLK2 and the internal clock signal LCLK0 match each other.

Turning to FIG. 9, the clock cycle of the internal clock signal LCLK0 is 2.0 ns, so that in a state where the phase of the internal clock signal LCLK2 matches the phase of the internal clock signal LCLK0, the delay amount of each of the variable delay circuits 210 and 220 is 1.0 ns. Among this delay amount, 400 ps is an intrinsic delay component (that is, the minimum delay amount) of each of the variable delay circuits 210 and 220, and 600 ps is an additional delay component added by the delay-amount adjustment unit 300. Therefore, by the operation of the mixer circuit 260, if the falling edge of the internal clock signal LCLK is defined in synchronization with the rising edge of the internal clock signal LCLK1 and the rising edge of the internal clock signal LCLK is defined in synchronization with the rising edge of the internal clock signal LCLK2, the duty cycle of the internal clock signal LCLK becomes substantially 50%. This operation is possible because the variable delay circuits 210 and 220 have the same circuit configuration as each other and are set to the same delay amount as each other.

Figure 10:
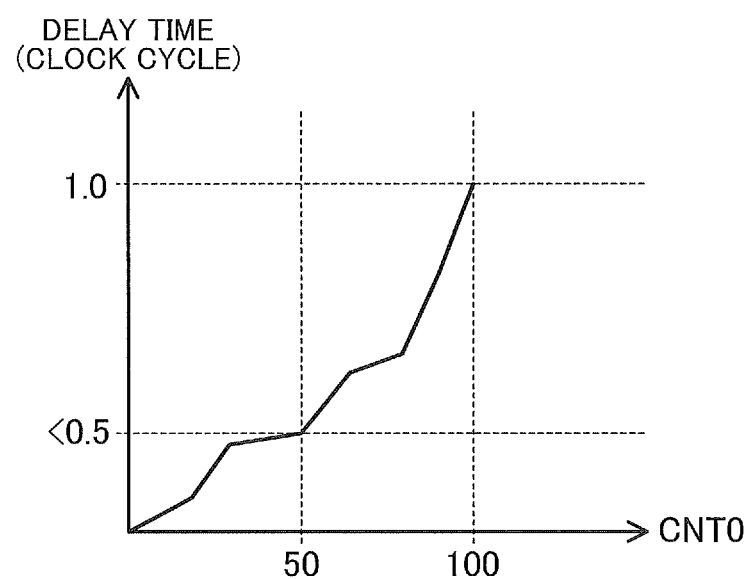
FIG. 10 is a diagram for explaining a problem occurred when a count value CNT0 applied to a delay line shown in FIG. 2 is simply set to ½ by a calculation and the falling edge timing of an internal clock signal LCLK is specified from a delay amount obtained by the value.

Turning to FIG. 10, when it is assumed that a delay of exactly one clock cycle is obtained when count value CNT0=100, ½ of the count value is 50. That is, the timing obtained at count value CNT0=50 becomes the falling edge timing of the internal clock signal LCLK. However, the relationship between the count value and the delay amount is not always linear. This is because some resistive elements and capacitive elements for adjustment are connected to the delay line 110 for a fine adjustment of the delay amount. For this reason, as shown in FIG. 10, the delay amount obtained at count value CNT0=50 is not exactly ½ of the delay amount obtained at count value CNT0=100. In the example shown in FIG. 10, the delay amount obtained at count value CNT0=50 is less than ½ of the delay amount obtained at count value CNT0=100, that is, less than ½ of a clock cycle.

Figure 11:
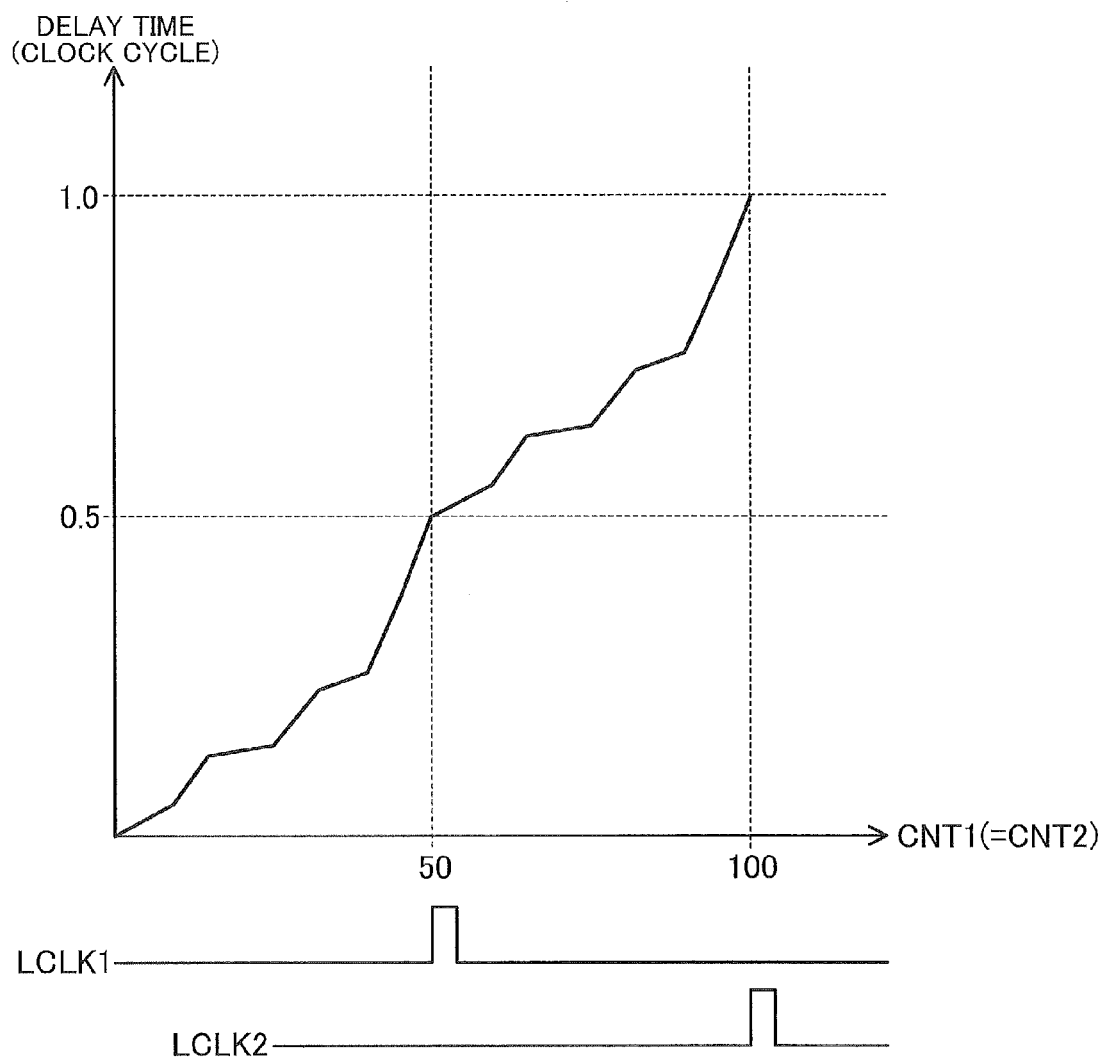
FIG. 11 is a diagram for explaining effects according to the duty-cycle correction circuit shown in FIG. 3.

On the other hand, in the first embodiment, because the variable delay circuits 210 and 220 have the same circuit configuration as each other and are set to the same delay amount as each other, it becomes possible to set the duty cycle to 50% regardless of the relationship between the count value and the delay amount whether it is linear. For example, as shown in FIG. 11, even when the relationship between each of the count values CNT1 and CNT2 and the delay amount obtained at the corresponding count value is not linear, the delay amount from the rising edge of the internal clock signal LCLK0 to the rising edge of the internal clock signal LCLK1 and the delay amount from the rising edge of the internal clock signal LCLK1 to the rising edge of the internal clock signal LCLK2 become always equal to each other. Therefore, it becomes possible to accurately adjust the duty cycle of the internal clock signal LCLK to 50%.

In the first embodiment, although two variable delay circuits 210 and 220 are connected in series and the delay amount of each of the variable delay circuits 210 and 220 is adjusted to ½ of a clock cycle, the present invention is not limited to this configuration. For example, if $2^n$ variable delay circuits are connected in series (n is a natural number), and if each of the delay amount of each of the variable delay circuits is adjusted to $\frac{1}{2}^n$ of a clock cycle (n is a natural number), it is possible to obtain a duty cycle of 50%. The first embodiment describes a case where n=1.

Figure 12A:
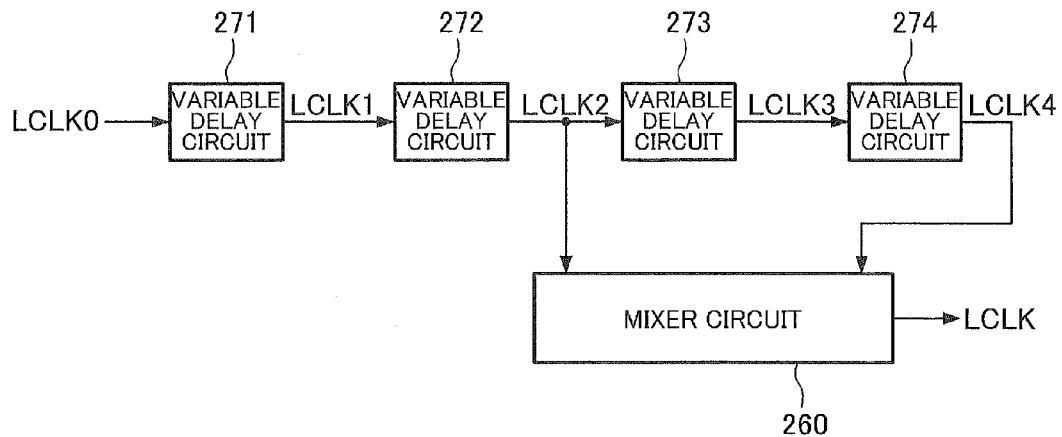
FIG. 12A is a circuit diagram indicative of a duty-cycle correction circuit wherein $2^n$ variable delay circuits are connected in series and n is set to be 2.
Figure 12B:
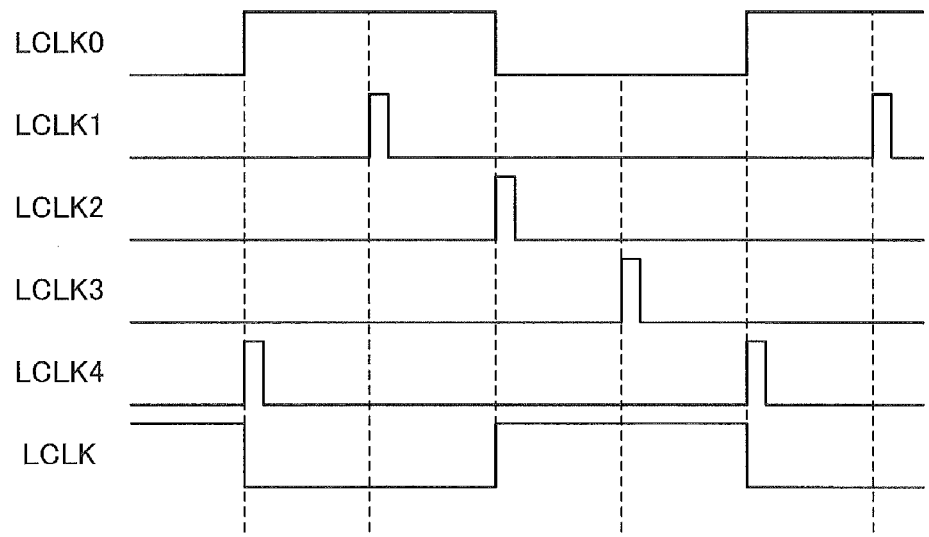
FIG. 12B is an operation waveform diagram of the duty-cycle correction circuit shown in FIG. 12A.

When n is set to be 2, as shown in FIG. 12A, it suffices that four variable delay circuits 271 to 274 are connected in series, and the delay amount of each of the variable delay circuits 271 to 274 are adjusted to ¼ of a clock cycle as shown in FIG. 12B. In this case, it suffices that one of the rising edge and the falling edge of the internal clock signal LCLK is defined based on an internal clock signal LCLKj, and the other of the rising edge and the falling edge of the internal clock signal LCLK is defined based on an internal clock signal LCLKk, where k=j+2. In the example shown in FIG. 12A, the internal clock signal LCLK2 output from the variable delay circuit 272 and the internal clock signal LCLK4 output from the variable delay circuit 274 are input to the mixer circuit 260, so as to generate the internal clock signal LCLK having a duty cycle of 50%.

Figure 13A:
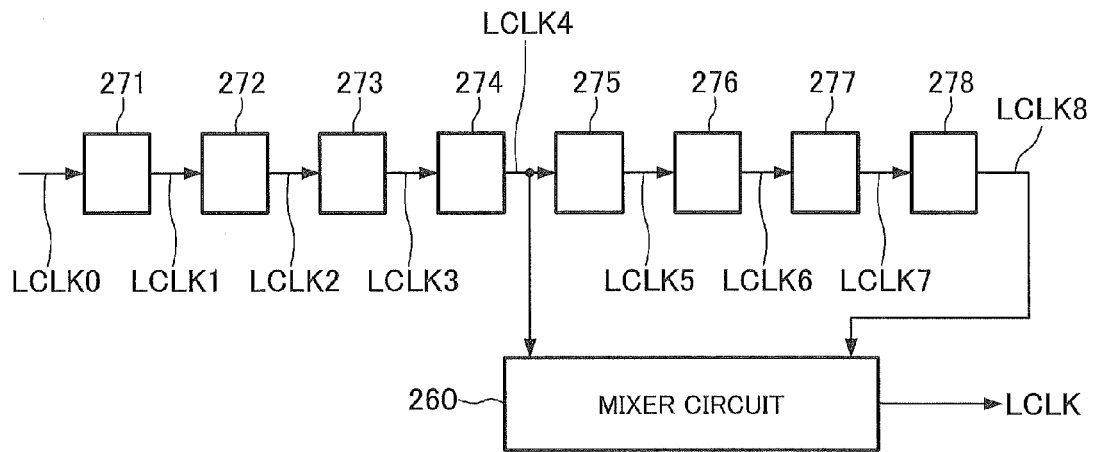
FIG. 13A is a circuit diagram indicative of an embodiment of a duty-cycle correction circuit wherein $2^n$ variable delay circuits are connected in series and n is set to be 3.
Figure 13B:
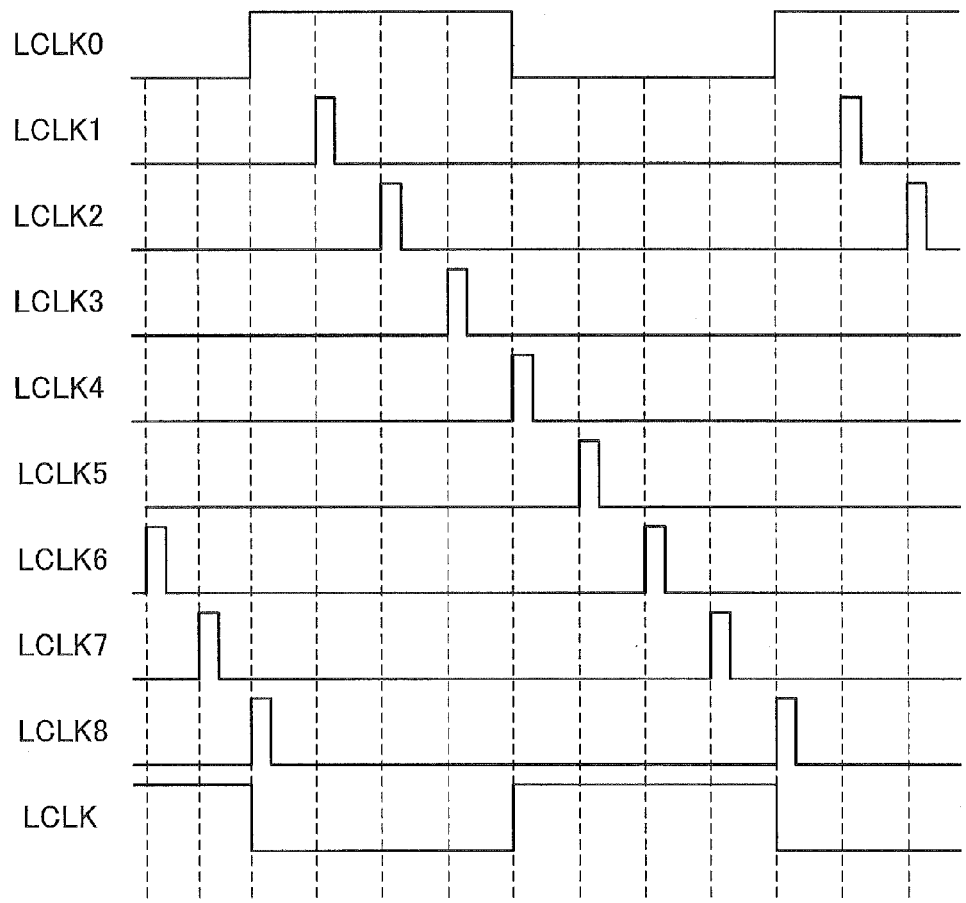
FIG. 13B is an operation waveform diagram of the duty-cycle correction circuit shown in FIG. 13A.

When n is set to be 3, as shown in FIG. 13A, it suffices that eight variable delay circuits 271 to 278 are connected in series, and the delay amount of each of the variable delay circuits 271 to 278 are adjusted to ⅛ of a clock cycle as shown in FIG. 13B. In this case, it suffices that one of the rising edge and the falling edge of the internal clock signal LCLK is defined based on an internal clock signal LCLKp, and the other of the rising edge and the falling edge of the internal clock signal LCLK is defined based on an internal clock signal LCLKq, where q=p+4. In the example shown in FIG. 13A, the internal clock signal LCLK4 output from the variable delay circuit 274 and the internal clock signal LCLK8 output from the variable delay circuit 278 are input to the mixer circuit 260, so as to generate the internal clock signal LCLK having a duty cycle of 50%.

As described above, in the present invention, the number of variable delay circuits to be connected in series is not limited to any particular number. Furthermore, as for the variable delay circuit to use, it is preferred to select a circuit having an output waveform of the one-shot pulse as in the first embodiment. The significance of using a variable delay circuit having an output waveform of a one-shot pulse is explained below.

Figure 14:
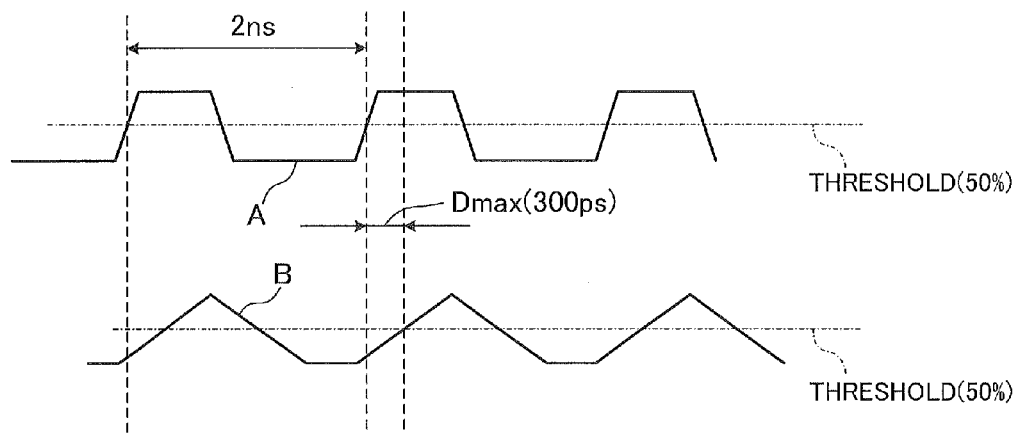
FIG. 14 is a timing diagram for explaining changes in waveforms in a case of using a general delay line, and the general delay line refers to a circuit that makes rising and falling edges of an input signal round.

Turning to FIG. 14, a signal A is a signal before the delay, and a signal B is a signal after the delay. As shown in FIG. 14, when both rising and falling edges of the signal A are made to be round, the signal B changes to have a triangular waveform. Accordingly, when the delay amount increases, that is, when rounding of rising and falling edges of the signal B increases, the pulses easily disappear. A maximum amount Dmax of the delay amount is limited in a range in which the pulses do not disappear. As an example, when it is assumed that a cycle of the signal A is 2 ns, a duty cycle of the signal A is 40%, a rising time and a falling time of the signal A are both 200 ps, and a threshold is a 50% level of amplitude, the maximum value Dmax of the delay amount is expressed as follows.

$$(2\ \text{ns} \times 40\% - 200\ \text{ps}) \times 50\% = 300\ \text{ps}$$

That is, it is required to set the delay amount to be equal to or smaller than 300 ps because the delay amount that exceeds 300 ps results in disappearance of the pulses.

Figure 15:
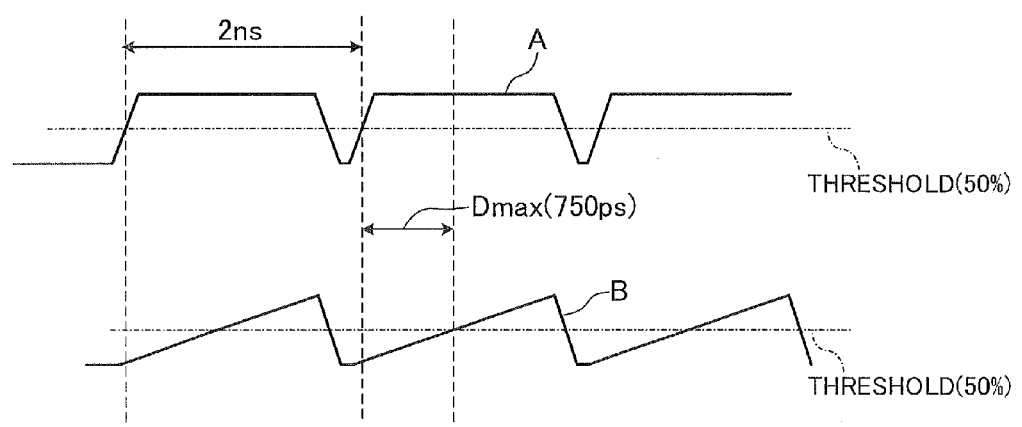
FIG. 15 is a timing diagram for explaining changes in waveform in a case of using a variable delay circuit having an output waveform of a one-shot pulse.

Turning to FIG. 15, a signal A is a signal before the delay, and a signal B is a signal after the delay. Because of the use of the variable delay circuit having the output waveform of a one-shot pulse, rising edges of the signal B are round as compared with those of the signal A, but falling edges of the signal B are substantially not round as compared with those of the signal A. Accordingly, the signal B has a saw-tooth waveform. In the present embodiment, similarly to the general delay line, the maximum value Dmax of the delay amount is limited in the range in which the pulses do not disappear. However, as an example, when it is assumed that a cycle of the signal A is 2 ns, a rising time and a falling time of the signal A are both 200 ps, a threshold is a 50% level of amplitude, and a one-shot pulse width of the signal A is 100 ps, the maximum value Dmax of the delay amount is expressed as follows.

$$\{2\ \text{ns} - (200\ \text{ps} + 100\ \text{ps}) - 200\ \text{ps}\} \times 50\% = 750\ \text{ps}$$

That is, this means that, although the signal A shown in FIG. 14 has the same cycle as that of the signal A shown in FIG. 15, the maximum value Dmax of the delay amount can be extended to 750 ps when the output waveform of the variable delay circuit is a one-shot pulse.

Furthermore, this maximum value Dmax (=750 ps) is an amount per one-shot pulse generation circuit. Therefore, by connecting a plurality of the variable delay circuits in series, a total delay amount is larger. Moreover, when the one-shot pulse generation circuits are used, the duty cycle of the input signal has no influence on the maximum value Dmax of the delay amount, as is clear from the above mathematical formula. Therefore, even if the duty cycle of the input signal changes, the maximum value Dmax of the delay amount does not change.

From these reasons, it is more preferable to use a circuit having an output waveform of a one-shot pulse rather than using a general delay line as the variable delay circuit. However, the present invention is not limited thereto.

In the first embodiment, n=1, and the internal clock signal LCLK is generated based on the internal clock signal LCLK1 and the internal clock signal LCLK2 that are input and output signals of the variable delay circuit 220, respectively. However, the present invention is not limited thereto. For example, the internal clock signal LCLK may be generated based on the internal clock signal LCLK0 and the internal clock signal LCLK1 that are input and output signals of the variable delay circuit 210, respectively.

Furthermore, when the number of variable delay circuits connected in series is x (x is a natural number), it is not essential that the delay amount of each of the variable delay circuits is 1/x of a clock cycle, but the delay amount of each of the variable delay circuits may be 1/y of a clock cycle (y is a natural number smaller than x). In other words, when the number of variable delay circuits connected in series is m×2$^n$ (m is a natural number) and the delay amount of each of the variable delay circuits is $\frac{1}{2}^n$ of a clock cycle, m can be an integer equal to or larger than 2. The first embodiment describes a case where m=1. When m is an integer equal to or larger than 2, it becomes possible to enhance the determination accuracy of the phase determination circuit 230.

Figure 16:
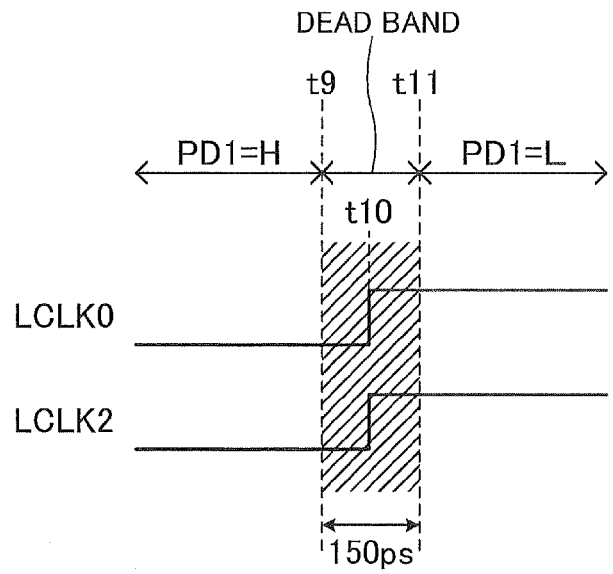
FIG. 16 is a diagram for explaining a determination accuracy of a phase determination circuit shown in FIG. 3.

Turning to FIG. 16, the rising edge of the internal clock signal LCLK0 that serves as a reference appears at a time t10. In this case, if the rising edge of the internal clock signal LCLK2 that is a target to be compared appears earlier than the time t10, the phase determination signal PD1 is supposed to be a high level, and if the rising edge of the internal clock signal LCLK2 appears later than the time t10, the phase determination signal PD1 is supposed to be a low level. However, because the phase determination circuit 230 has a predetermined determination accuracy limit, the correct determination cannot be assured near the time t10. A range of times t9 to t11 shown in FIG. 16 is a range in which the correct determination cannot be assured, which is referred to as "dead band". Although the phase determination signal PD1 of a high level or a low level is output from the phase determination circuit 230 even when the rising edge of the internal clock signal LCLK2 that is the target to be compared is located in the range of the dead band, this output may not be a reliable determination result. The dead band has a width of 150 ps, for example.

Figure 17:
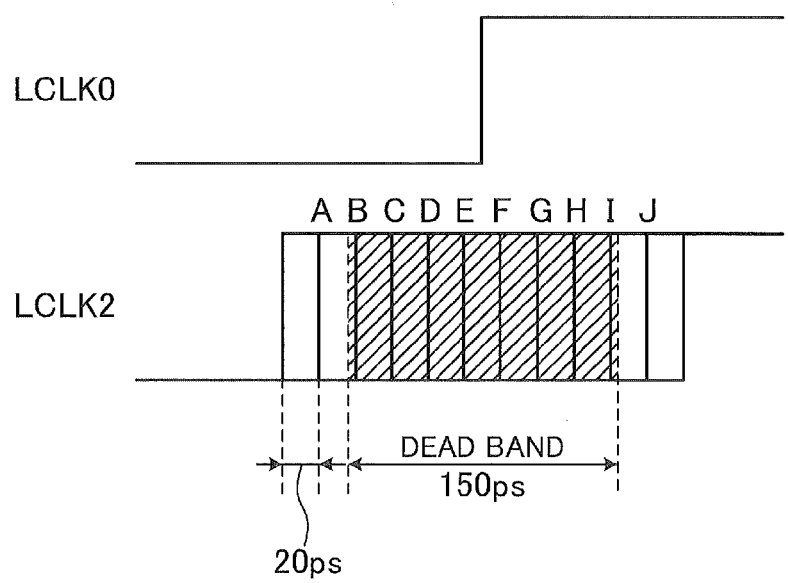
FIG. 17 is a diagram for explaining a relationship between count values CNT1 and CNT2 shown in FIG. 3 and a dead band shown in FIG. 16.

Turning to FIG. 17, it shows a case where a control pitch of the delay amount of each of the variable delay circuits 210 and 220 respectively controlled by the count values CNT1 and CNT2 is 10 ps. As shown in FIG. 3, the variable delay circuits 210 and 220 having the same characteristic are connected in series in the first embodiment, and therefore the control pitch of the internal clock signal LCLK2 input to the phase determination circuit 230 becomes 20 ps (=10 ps×2). The timings A to J shown in FIG. 17 indicate the rising edges of the internal clock signal LCLK2 obtained by changing the count values CNT1 and CNT2.

If it is assumed that the dead band has a width of 150 ps, the rising edges B to I of the internal clock signal LCLK2 are located in the range of the dead band, where the correct control cannot be performed. That is, even if each of the variable delay circuits 210 and 220 can change the delay amount in the pitch of 10 ps, because the phase determination circuit 230 has the dead band of 150 ps, the accuracy of the variable delay circuits 210 and 220 cannot be utilized effectively. This problem can be solved by performing oversampling by setting the value of m to an integer equal to or larger than 2. A second embodiment of the present invention in which the determination accuracy of a phase determination circuit is enhanced by oversampling is explained below.

Figure 18:
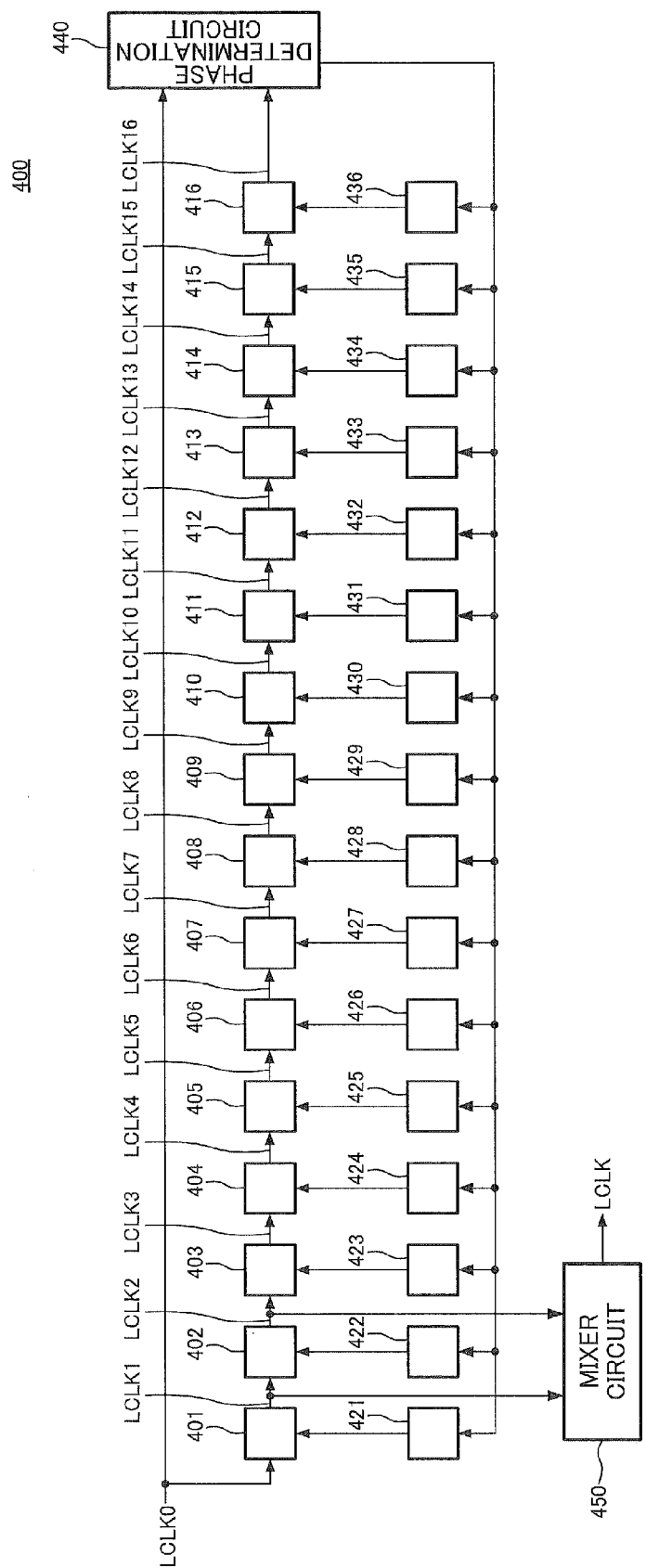
FIG. 18 is a circuit diagram indicative of a duty-cycle correction circuit according to a second embodiment.

Turning to FIG. 18, the duty-cycle correction circuit 400 according to the second embodiment includes 16 variable delay circuits 401 to 416 connected in series. Each of the variable delay circuits 401 to 416 has the same circuit configuration as the variable delay circuits 210 and 220 shown in FIG. 4. Delay amounts of the variable delay circuits 401 to 416 are respectively controlled by counter circuits 421 to 436 to be the same as one another. Count values of the counter circuits 421 to 436 are commonly controlled by a phase determination circuit 440 that compares the internal clock signal LCLK0 input to the variable delay circuit 401 at the first stage with an internal clock signal LCLK16 output from the variable delay circuit 416 at the last stage.

The internal clock signal LCLK1 input to the variable delay circuit 402 at the second stage and the internal clock signal LCLK2 output from the variable delay circuit 402 at the second stage are supplied to a mixer circuit 450, and the internal clock signal LCLK is generated based on these supplied internal clock signals.

Also in the second embodiment, the delay amount of each of the variable delay circuits 401 to 416 is controlled to be ½ of a clock cycle of the internal clock signal LCLK0. Therefore, the second embodiment describes a case where the above-mentioned value of m is 8 and the value of n is 1.

Figure 19:
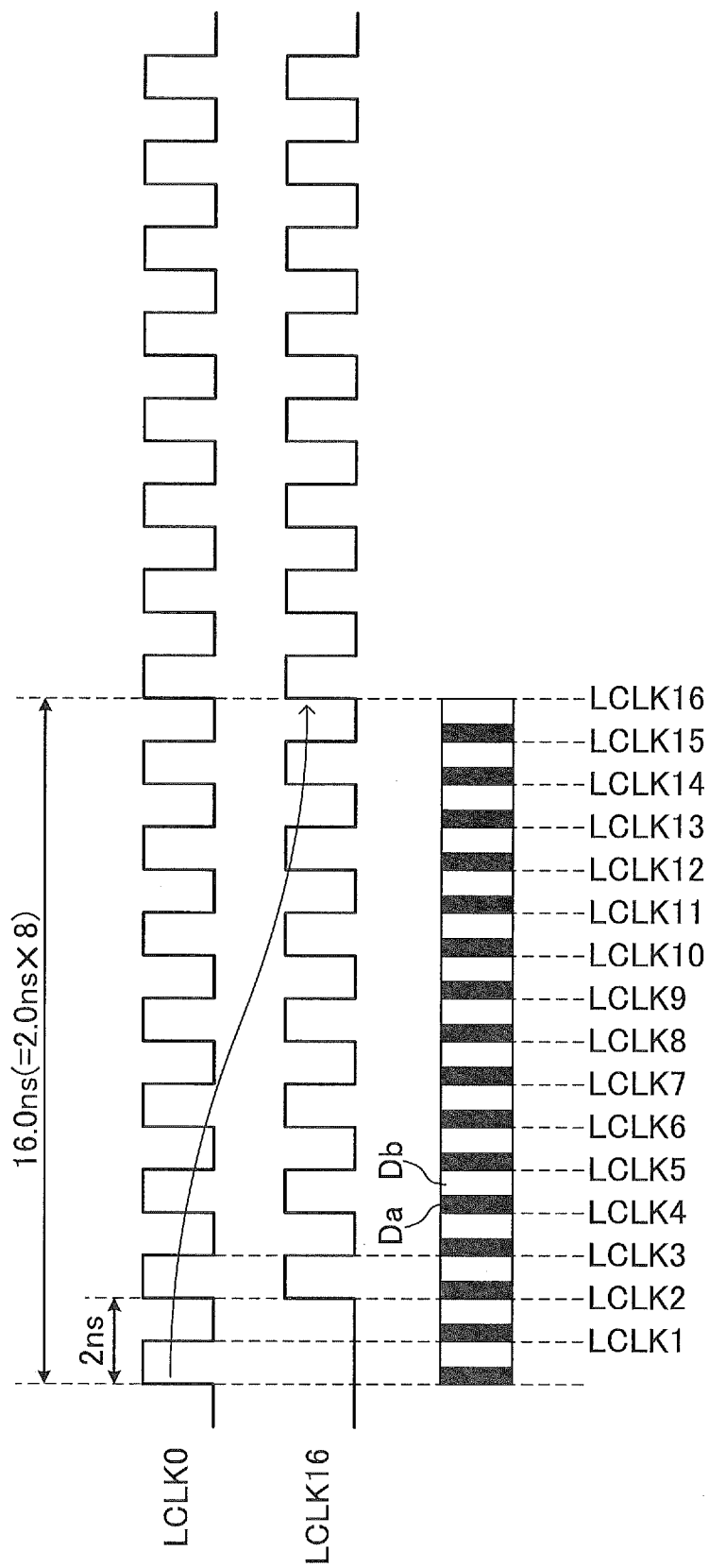
FIG. 19 is a timing diagram for explaining an operation of the duty-cycle correction circuit shown in FIG. 18.

Turning to FIG. 19, because the value of m is 8, the duty-cycle correction circuit 400 according to the second embodiment is controlled such that the delay amount of the variable delay circuits 401 to 416 is equal to eight clock cycles of the internal clock signal LCLK0. The clock cycle of the internal clock signal LCLK0 is also 2.0 ns in the second embodiment, and therefore in a state where the phase of the internal clock signal LCLK16 matches the phase of the internal clock signal LCLK0, the delay amount of each of the variable delay circuits 401 to 416 is 1.0 ns. Among the delay amount, 400 ps is an intrinsic delay component (that is, the minimum delay amount) of each of the variable delay circuits 401 to 416, and 600 ps is an additional delay component added by a delay-amount adjustment unit 300 included in each of the variable delay circuits 401 to 416. In FIG. 19, an intrinsic delay component Da is represented by black and a variable delay component Db is represented by white.

Figure 20:
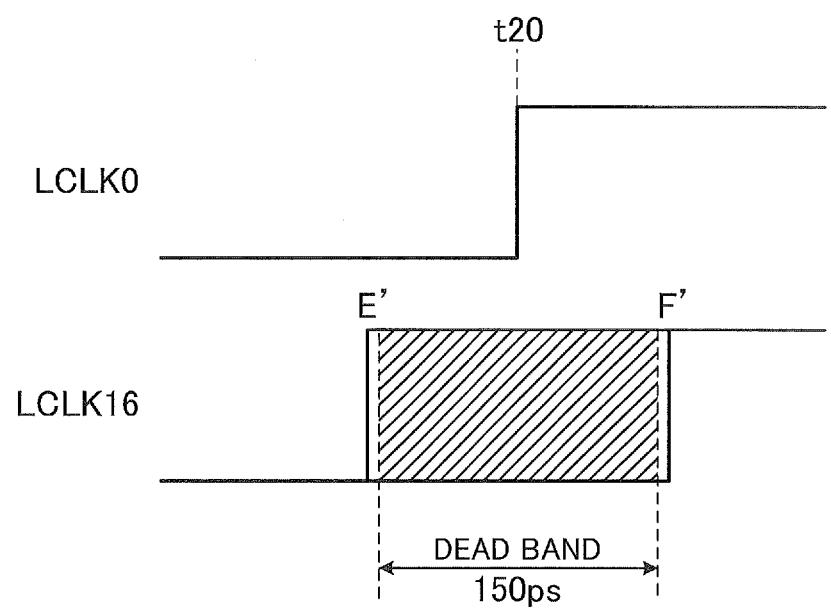
FIG. 20 is a diagram for explaining a determination accuracy of a phase determination circuit shown in FIG. 18.

Turning to FIG. 20, the rising edge of the internal clock signal LCLK0 appears at a time t20, and a dead band centering on the time t20 has a width of 150 ps. Although the control pitch of the delay amount of each of the variable delay circuits 401 to 416 is 10 ps in this example, because 16 variable delay circuits 401 to 416 having the same characteristic are connected in series in the second embodiment, the control pitch of an internal clock signal LCLK16 input to the phase determination circuit 440 becomes 160 ps (=10 ps×16). Timings E' and F' shown in FIG. 20 mean the rising edges of the internal clock signal LCLK16 obtained by changing count values CNT1 to CNT16.

Although the dead band has a width of 150 ps also in this example, because the control pitch of the internal clock signal LCLK16 is expanded to 160 ps by performing eight times of oversampling, it becomes possible to avoid an instance where the rising edge of the internal clock signal LCLK16 is located in the dead band. In the example shown in FIG. 20, the rising edge of the internal clock signal LCLK16 is located outside the dead band at the both timings E' and F', and therefore it becomes possible to correctly control the counter circuits 421 to 436.

In this manner, in the duty-cycle correction circuit 400 according to the second embodiment, by performing eight times of oversampling, it becomes possible to enhance the determination accuracy of the phase determination circuit 440 by equivalently eight times. That is, because the width of the dead band becomes equivalently ⅛, it becomes possible to prevent degradation of the correction accuracy of the duty cycle of the phase determination circuit caused by the dead band. When the oversampling is performed, it takes more time to correct the duty cycle than in the first embodiment because a time for eight clock cycles is required to correctly correct the duty cycle to 50%. However, because a time for 16 to 32 clock cycles is often required in a conventional duty-cycle correction circuit using the two capacitors, as compared to such conventional circuits, it becomes possible to perform the correction at a higher speed.

It is apparent that the present invention is not limited to the above embodiments, but may be modified and changed without departing from the scope and spirit of the invention.

For example, in the above embodiment, the transistors 331 to 335 that constitute the driver circuits are configured to have different driving capabilities by making the channel widths of the transistors 331 to 335 different. Alternatively, as another method of making the driving capabilities different, different channel lengths can be set to the transistors 331 to 335 or different fan-outs can be set to the transistors 331 to 335, respectively. In addition, it is not always essential to make the driving capabilities of the respective driver circuits different, and the same driving capability can be set to these driver circuits. Nevertheless, by making the driving capabilities of these driver circuits different (particularly by giving power-of-two weights to the respective driver circuits), it is possible to extend the adjustment range while ensuring a fine adjustment pitch.

In the present invention, it is not essential to provide an individual counter circuit for each of the variable delay circuits, and a count value of a single counter circuit may be commonly supplied to the variable delay circuits.

Furthermore, in the present invention, it is not essential that the duty cycle of the clock signal is corrected to 50%, and the duty cycle may be controlled to a desired value.

Figure 21:
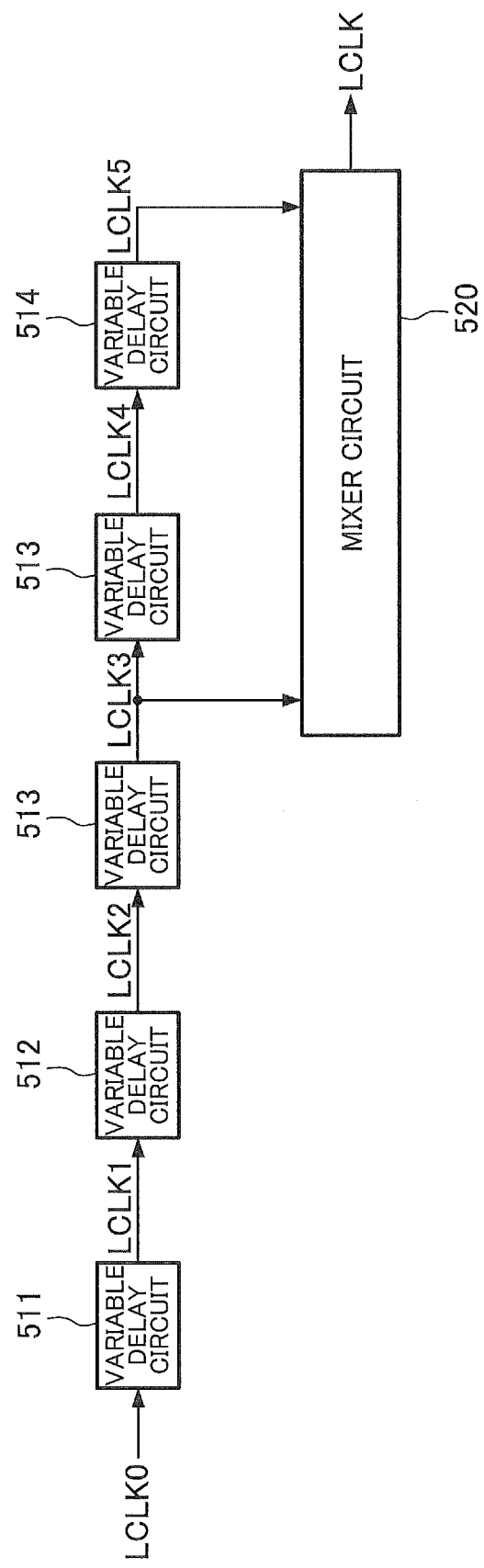
FIG. 21 is a circuit diagram indicative of a duty-cycle correction circuit according to a first modified embodiment.

For example, as shown in FIG. 21, by connecting five variable delay circuits 511 to 515 that are controlled to the same delay amount as one another in series and matching the phases of the internal clock signal LCLK0 input to the variable delay circuit 511 at the first stage and the internal clock signal LCLK5 output from the variable delay circuit 515 at the last stage, it is possible to generate the internal clock signal LCLK having a duty cycle other than 50% by a combination of two clock signals among the internal clock signals LCLK1 to LCLK5 to be coupled to a mixer circuit 520. In the example shown in FIG. 21, the internal clock signal LCLK3 at the third stage and the internal clock signal LCLK5 at the fifth stage are input to the mixer circuit 520, and therefore it becomes possible to control the duty cycle of the internal clock signal LCLK to 60% (or 40%).

Figure 22:
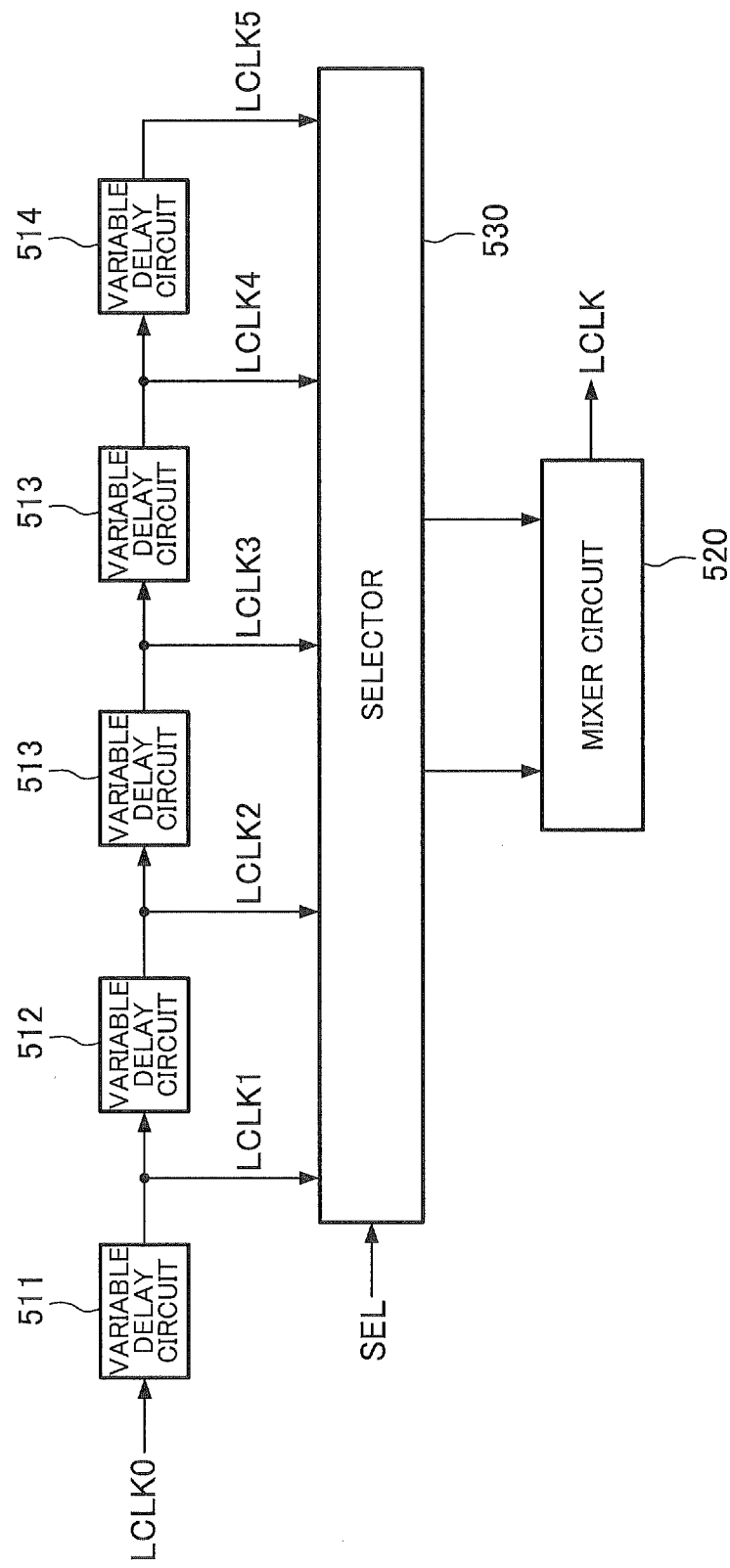
FIG. 22 is a circuit diagram indicative of an embodiment of a duty-cycle correction circuit according to a second modified embodiment.

Alternatively, as shown in FIG. 22, by inputting all the internal clock signals LCLK1 to LCLK5 to a selector 530, selecting any two clock signals from the internal clock signals LCLK1 to LCLK5 based on a select signal SEL, and supplying the selected clock signals to the mixer circuit 520, it becomes possible to arbitrarily select the duty cycle of the internal clock signal LCLK from 20%, 40%, 60%, and 80%.

What is claimed is:

1. A semiconductor device comprising:
   an input node supplied with a first clock signal;
   an output node outputting a second clock signal;
   a plurality of variable delay circuits connected in series between the input node and the output node;
   a control circuit commonly controlling the variable delay circuits based on phases of the first and second clock signals; and
   a mixer circuit generating a third clock signal based on one of a plurality of input clock signals and one of a plurality of output clock signals, each of the plurality of input clock signals supplied to an associated one of the variable delay circuits, and each of the plurality of output clock signals output from an associated one of the variable delay circuits.

2. The semiconductor device as claimed in claim 1, wherein the control circuit includes:
   a phase determination circuit that generates a phase determination signal by comparing a phase of the first clock signal with a phase of the second clock signal; and
   a counter circuit of which a count value is controlled based on the phase determination signal, and delay amounts of the variable delay circuits are commonly controlled based on the count value.

3. The semiconductor device as claimed in claim 1, wherein the control circuit controls delay amounts of the variable delay circuits such that the delay amount of each of the variable delay circuits becomes $½^n$ of the first clock cycle, where n is a natural number.

4. The semiconductor device as claimed in claim 3, wherein a value of n is 1, and the one of the input clock signals and the one of the output clock signals are respectively input to and output from a predetermined one of the variable delay circuits.

5. The semiconductor device as claimed in claim 3, wherein number of the variable delay circuits is $m \times 2^n$ where m is a natural number.

6. The semiconductor device as claimed in claim 5, wherein a value of m is an integer equal to or larger than 2.

7. The semiconductor device as claimed in claim 1, wherein each of the variable delay circuits defines a rising edge timing and a falling edge timing of the output clock signal in response to one of a rising edge and a falling edge of the input clock signal, and a time period from one of the rising edge and the falling edge of the input clock signal to the other of the rising edge and the falling edge of the output clock signal is variable.

8. The semiconductor device as claimed in claim 7, wherein each of the variable delay circuits includes:
   a delay-amount adjustment unit;
   a first signal path that passes through the delay-amount adjustment unit; and
   a second signal path that does not pass through the delay-amount adjustment unit, one of the rising edge timing and the falling edge timing of the output clock signal is defined in response to the one of the rising edge and the falling edge of the input clock signal output from the second signal path, and the other of the rising edge timing and the falling edge timing of the output clock signal is defined in response to the one of the rising edge and the falling edge of the input clock signal output from the first signal path.

9. The semiconductor device as claimed in claim 8, wherein the delay-amount adjustment unit includes a plurality of driver circuits connected in parallel, and the time period is set to be variable by selecting one or more driver circuits to be used.

10. The semiconductor device as claimed in claim 9, wherein at least two driver circuits among the driver circuits have a different driving capability from each other.

11. The semiconductor device as claimed in claim 1, wherein the control circuit commonly controls the variable delay circuits such that delay amounts of the variable delay circuits substantially match each other, and the mixer circuit defines one of a rising edge and a falling edge of the third clock signal based on the one of the input clock signals and the other of the rising edge and the falling edge of the third clock signal based on the one of the output clock signals.

12. A method of controlling a semiconductor device, the method comprising:
   generating a first clock signal by delaying an input clock signal based on a delay time;
   generating a second clock signal by delaying the first clock signal based on the delay time;
   comparing a phase of the second clock signal with a phase of the input clock signal to control the delay time; and
   mixing the first clock signal and the second clock signal to generate a third clock signal.

13. The method of controlling the semiconductor device as claimed in claim 12, wherein the comparing includes: generating a phase determination signal by comparing a phase of the second clock signal with a phase of the input clock signal; and outputting a count value based on the phase determination signal.

14. The method of controlling the semiconductor device as claimed in claim 13, wherein the delay time is controlled based on the count value.

15. The method of controlling the semiconductor device as claimed in claim 12, wherein the generating the first clock signal defines a rising edge timing and a falling edge timing of the first clock signal in response to one of a rising edge and a falling edge of the input clock signal, and the generating the second clock signal defines a rising edge timing and a falling edge timing of the second clock signal in response to one of a rising edge and a falling edge of the first clock signal.

16. The method of controlling the semiconductor device as claimed in claim 15, wherein a time period from one of the rising edge and the falling edge of the input clock signal to the other of the rising edge and the falling edge of the first clock signal is set to be variable based on the delay time, and a time period from one of the rising edge and the falling edge of the first clock signal to the other of the rising edge and the falling edge of the second clock signal is set to be variable based on the delay time.

* * * * *